US006596200B1

(12) United States Patent
Ogawa et al.

(10) Patent No.: US 6,596,200 B1
(45) Date of Patent: Jul. 22, 2003

(54) ELECTRONIC MATERIAL COMPOSITION, ELECTRONIC PARTS AND USE OF ELECTRONIC MATERIAL COMPOSITION

(75) Inventors: Hideki Ogawa, Tokyo (JP); Kinya Iri, Tokyo (JP); Mitsuyoshi Ito, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 153 days.

(21) Appl. No.: 09/608,621

(22) Filed: Jun. 30, 2000

(30) Foreign Application Priority Data

Jun. 30, 1999 (JP) .......................................... 11-184669
May 29, 2000 (JP) ...................................... 2000-157511

(51) Int. Cl.$^7$ ............................. H01B 1/22; H01F 1/00; H01C 3/00; H05K 1/09
(52) U.S. Cl. ................. 252/512; 252/62.54; 252/62.55; 336/15; 336/20; 338/302; 174/110 R; 174/257
(58) Field of Search ................................ 252/511, 512, 252/62.54, 62.55; 336/15, 20, 73, 221; 338/270, 302; 528/109, 381; 525/535; 174/110 AR, 257

(56) References Cited

U.S. PATENT DOCUMENTS

| | | | | | |
|---|---|---|---|---|---|
| 4,574,262 A | * | 3/1986 | Hamazawa et al. | ......... | 336/192 |
| 5,521,274 A | * | 5/1996 | Wilford | ....................... | 528/109 |
| 5,665,797 A | * | 9/1997 | Tahara et al. | ................ | 523/400 |
| 5,693,714 A | * | 12/1997 | Bauman et al. | ............. | 525/104 |
| 6,119,924 A | * | 9/2000 | Toi et al. | ................. | 228/179.1 |

* cited by examiner

Primary Examiner—Mark Kopec
(74) Attorney, Agent, or Firm—Birch, Stewart, Kolasch & Birch, LLP

(57) ABSTRACT

Provided is an electronic material composition which is capable of forming a cured film exhibiting a desired glass transition temperature, a desired stiffness modulus in a rubbery state and a desired extensibility at low temperatures. Also provided is an electronic component comprising a molded body, a packed body, a covering body, an electrode or a joining body, all being formed of the aforementioned electronic material composition. Also provided is a method of using the aforementioned electronic material composition, which is featured in that the electronic material composition is applied in a semi-cured state, and after the application thereof, completely cured.

59 Claims, 12 Drawing Sheets

$$HS-\underline{(C_2H_4-O-CH_2-O-C_2H_4-S-S)_n-C_2H_4-O-CH_2-O-C_2H_4}-SH$$

(UNDERLINED PORTION WILL BE REPRESENTED BY R)

GREATLY EXTENSIBLE

+

(UNDERLINED PORTION WILL BE REPRESENTED BY R')

SLIGHTLY EXTENSIBLE

GREATLY EXTENSIBLE     SLIGHTLY EXTENSIBLE

ELECTRONIC MATERIAL COMPOSITION, ELECTRONIC PARTS AND USE OF ELECTRONIC MATERIAL COMPOSITION

BACKGROUND OF THE INVENTION

The present invention relates to an electronic material composition comprising a specific resin component, to electronic components to be manufactured from the employment of such an electronic material composition, and to the using method of such an electronic material composition.

Curable resins such as epoxy resin are employed as an important component in an electronic material composition which may or may not be mixed with a powdery electronic material such as ferrite powder or metallic powder in the employment thereof. Such electronic materials comprising a curable resin or a powdery electronic material are extensively employed mainly as a material for the manufacture of electronic components, e.g. as a molding material, a coating material, an electrode material, a bonding material, etc.

More specifically, the electronic materials can be employed as an electronic material for the following end-uses (1) to (5).

(1) As for the usage as a molding material of the electronic materials, they can be employed as a material on the occasion of manufacturing the core of wound chip coil for instance. In this case, ferrite powder is granulated together with a resin component and other components as required to obtain granules, which are then dry-molded into a rod like configuration and subjected to a curing treatment. The cured body thus obtained is then subjected to a cutting work to obtain a core whose both ends are provided with a flange. The same procedure can be also applied to the manufacture of the spool of air-core coil though the procedure involves no cutting work in this case. There is also known a so-called working-less manufacturing method wherein ferrite powder is wet-mixed with a resin component and a solvent to obtain a composition which is then molded by means of injection molding for instance to form a molded body, the molded body being subsequently cured.

(2) As for the usage of the electronic material as a coating material, there are four cases (a) to (d) as set forth below.

(a) The electronic material can be employed as an outer packaging material in such a manner that after a winding is applied to the aforementioned core, the resultant coil is coated with the electronic material.

(b) The electronic material can be employed as an electromagnetic shielding material covering the surface of a casing housing an electronic component. In this case, magnetic material powder is mixed with a resin component to obtain a mixture which is then molded into a sheet, a plurality of which are then simply adhered to each other so as to cover the surface of the casing. There is also known a case wherein the casing itself is constituted by a molded body molded from a mixture comprising metallic powder and a resin component.

(c) The electronic material can be employed as a covering material for a connecting cable of a digital video camera, a personal computer, a printer, etc. In this case, a resin component is turned into a molten state and then, extruded together with the cable.

(d) The electronic material can be employed as a covering material for covering the entire surface, including an electronic component, of a printed wiring board having an electronic component mounted thereon.

(3) As for the usage as an electrode material of the electronic materials, they can be employed as a conductive paste containing a glass frit and silver powder for instance, the paste being coated and then, baked to form an external terminal electrode of a chip component. There is also known a case wherein a conductive paste obtained through the mixing of conductive powder with a resin component and a solvent is coated on a chip component and then, baked to form an external terminal electrode likewise.

(4) As for the usage of the electronic material as a bonding material, there are two cases (a) and (b) as set forth below.

(a) The electronic material can be employed as a solder for soldering a chip component for example onto the soldering land of a printed wiring board.

(b) As in the case of manufacturing an LC laminated composite electronic component for instance, the electronic material can be employed as an adhesive material, i.e. as an interconnecting sheet in bonding different kinds of sheets with each other, for instance in a process wherein a green sheet laminate consisting of the same kind of material is laminated with another green sheet laminate consisting of the same kind of another material differing from the first mentioned material to form a composite laminate body, which is then baked to form an LC element. Namely, in this case, these green sheets can be formed of an electronic material composition wherein ferrite powder or dielectric material powder is wet-mixed with a resin and a solvent.

(5) As for the usage as a filler of the electronic materials, they can be employed for filling a joint portion in a situation wherein the wall of building is to be formed by joining electromagnetic shielding boards, panels or tiles to each other.

In relative to the aforementioned end-use (1), there is an increasing demand for the miniaturization of core in accordance with the recent trend to further miniaturize an electronic component. However, as the core becomes smaller, the rigid and fragile nature of the ferrite material becomes more prominent, thus making it difficult to exercise a fine working of the core. As a result, an off-specification product tends to generate, thus deteriorating the yield of the core. In the case of the core which is injection-molded using an electronic material composition prepared through a wet-mixing also, the toughness of core is insufficient. From a reflow soldering test wherein these worked or molded products are subjected to a thermal stress in the soldering step, these worked product as well as molded product are found accompanied with a problem in terms of strength.

In relative to the aforementioned end-use (2)(a), the conventional outer packaging material is accompanied with a problem in the mounting operation of so-called bulk component wherein individual component is picked up by means of an adsorption nozzle from an aggregate consisting of a large number of chips of the same kind and transferred so as to mount it at a predetermined region of a printed wiring board, because the outer packaging material is so rigid and hardly deformable that a gap tends to be generated between the adsorption nozzle and the surface portion of the outer packaging material being adsorbed, thus making it difficult for the adsorption nozzle to pick up the individual component due to slipping between them. Namely, a problem of mis-mount tends to be raised in picking up individual chip component from a large number of chips of the same kind. With a view to minimize this mis-mount, there has been conventionally proposed to improve the accuracy in configuration of the component. However, such a countermeasure is limited in terms of yield.

In relative to the aforementioned end-use (2)(b), when the configuration of casing includes a complicatedly deformed portion such as a complicatedly bent portion or a fine recessed and projected portion, it is difficult to closely adhere electromagnetic shielding sheets onto the wall of the casing. As a result, a sufficient electromagnetic shielding effect may not be ensured.

In relative to the aforementioned end-use (2)(a) and (2)(b), due to a thermal stress resulting from a difference in linear expansion coefficient between the coating material and the surface to be coated, the adhesion plane may be peeled off or a damage such as cracking may be generated in the coating material.

In relative to the aforementioned end-use (2)(c), since the coating material is formed of a resin material, the electromagnetic wave generated from the current flowing through the conductive wire of cable is allowed to radiate into the ambient atmosphere. As a result, the electronic instruments disposed around the cable would be badly affected by the electromagnetic wave, so that it is impossible to suppress so-called radiant noise which may become a cause for the malfunction of the electronic instruments. With a view to overcome this problem, there has been conventionally proposed a cable which is covered with a coating material formed of a magnetic material composition containing, as a resin component, acrylic-modified polyester resin. However, as for the cable which is an ordinary covered conductor not having such a countermeasure, there is no other way but to use as it is, so that such an ordinary cable, including the cable which has been already wired, is still accompanied with a problem that it is impossible to suppress the aforementioned radiant noise.

In relative to the aforementioned end-use (3), the electrode which is formed through the baking of a mixture comprising powdery silver and glass frit is employed on the occasion of soldering an electronic component to the soldering land of a printed wiring board. However, since the linear expansion coefficient of the electrode differs from that of the soldering land, a stress tends to generate between them due to changes in temperature. As a result, the electronic component is badly affected by such a stress, thereby deteriorating the durability of the electronic component in terms of keeping a predetermined performance thereof. The same problem as mentioned above is also applicable to the electrode which is formed through the baking of a mixture comprising powdery conductive material and a resin component. Because, since epoxy resin is employed as the resin component, the aforementioned thermal stress cannot be alleviated.

In relative to the aforementioned end-use (4)(a), since the solder to be employed for bonding the external terminal electrode of electronic component to the soldering land is so rigid and hardly deformable that it is impossible to alleviate the stress to be generated, due to changes in temperature, between the electrode and the soldering land as in the case of the aforementioned end-use (3), the electronic component would be badly affected by the stress, thereby deteriorating the durability of the electronic component. Therefore, if the problem pointed out in the aforementioned end-use (3) happens to occur simultaneously with this phenomenon, the durability of the electronic component would be further deteriorated.

In relative to the aforementioned end-use (4)(b), since, for example, a ferrite green sheet laminate constituting a composite laminate body differs in shrinkage factor from a dielectric material green sheet laminate also constituting the composite laminate body, cracks may be more likely to be generated on the occasion of baking the composite laminate body. Even if a baked body which is free from cracks can be obtained, since the composite laminate body is constituted by different kinds of green sheet laminates differing in linear expansion coefficient, cracks may be more likely to be generated in the baked body when the baked body is left under the conditions where the temperature thereof is caused to change, especially when the baked body is repeatedly left under such conditions.

In relative to the aforementioned end-use (5), although a silicone resin is generally employed as a filler, it is impossible to prevent an electromagnetic wave from entering into a building from the outside thereof through the filler containing the silicon resin, and at the same time, an electromagnetic wave generated form electronic instruments such as a personal computer employed inside the building is allowed to leak to the outside of the building through the resin-filled portions between electromagnetic shielding boards, panels or tiles, thereby raising a problem of the leakage of information via this leaked electromagnetic wave.

BRIEF SUMMARY OF THE INVENTION

Therefore, a fist object of this invention is to provide an electronic material composition which enables to obtain a molded body having a sufficient strength even if the molded body is miniaturized, being suited for improving the yield, and being resistive to a sharp change of temperature, to provide an electronic component formed of such an electronic material composition, and to provide the use of such an electronic material composition.

A second object of this invention is to provide an electronic material composition to be employed for manufacturing an external packaging material which is capable of withstanding a stress that may be generated under a thermal load on the occasion of reflow soldering or on the occasion of heat cycle test, to provide an electronic component formed of such an electronic material composition, and to provide the use of such an electronic material composition.

A third object of this invention is to provide an electronic material composition to be employed for manufacturing an external packaging material having a sufficient flexibility enabling to obtain a bulk component which can be easily adsorbed by an adsorption nozzle of a mounter, and exhibiting an excellent resistivity to a thermal stress that may be generated due to a difference in linear expansion coefficient between the external packaging material and a body to be packaged, to provide an electronic component formed of such an electronic material composition, and to provide the use of such an electronic material composition.

A fourth object of this invention is to provide an electronic material composition to be employed for manufacturing a covering material having a sufficient flexibility enabling to cover a casing having a complicated surface configuration in conformity with the complicated surface configuration so as to ensure a sufficient electromagnetic shielding, and exhibiting an excellent resistivity to a thermal stress that may be generated due to a difference in linear expansion coefficient between the covering material and a body to be covered, to provide an electronic component formed of such an electronic material composition, and to provide the use of such an electronic material composition.

A fifth object of this invention is to provide an electronic material composition to be employed for manufacturing a covering material or a casing material, which is capable of preventing the generation of radiant noise, to provide an electronic component formed of such an electronic material composition, and to provide the use of such an electronic material composition.

A sixth object of this invention is to provide an electronic material composition to be employed for forming an external electrode for electronic component, which is capable of alleviating a stress resulting from changes in temperature of the electronic component even if the stress is generated in an electronic component mounted on a printed wiring board, to provide an electronic component formed of such an electronic material composition, and to provide the use of such an electronic material composition.

A seventh object of this invention is to provide an electronic material composition to be employed for bonding an electronic component to a printed wiring board, which is capable of alleviating a stress even if the stress is generated in the electronic component from changes in temperature thereof, to provide an electronic component formed of such an electronic material composition, and to provide the use of such an electronic material composition.

An eighth object of this invention is to provide an electronic material composition to be employed for manufacturing a bonding material which enables to obtain a bonded body of a couple of members, which is capable of absorbing a difference, if any, in irreversible expansion coefficient or shrinkage factor between these member due to the heat-treatment, thereby making it possible to prevent the generation of cracks in the bonded body, to provide an electronic component formed of such an electronic material composition, and to provide the use of such an electronic material composition.

A ninth object of this invention is to provide an electronic material composition which is capable of withstanding a thermal stress under a condition where temperature is differentiated, even if the electronic material composition is employed as a bonding material for bonding a plurality of members each having a different linear expansion coefficient from each other, or as a covering material for covering a plurality of members each having a different linear expansion coefficient, to provide an electronic component formed of such an electronic material composition, and to provide the use of such an electronic material composition.

A tenth object of this invention is to provide an electronic material composition which enables to obtain a filler to be employed for manufacturing an electromagnetic shielding wall which is capable of preventing an electromagnetic wave from entering or leaking through a gap between the electromagnetic shielding boards, panels or tiles of building, to provide an electronic component formed of such an electronic material composition, and to provide the use of such an electronic material composition.

A eleventh object of this invention is to provide the use of an electronic material composition which enables to prevent an object from being damaged which may be caused due to the heating for curing, and to provide an electronic component to be obtained from the use of such an electronic material composition.

With a view to solve the aforementioned problems, this invention provides (1) an electronic material composition comprising at least a curable polymer and exhibiting the following physical properties (a) and (b) after being cured to form a cured body;

(a) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.; and (b) stiffness modulus in said rubbery state which is in the range of $10^5$ Pa to $10^7$ Pa.

This invention further provides (2) an electronic material composition comprising at least a curable polymer and exhibiting the following physical properties (a), (b) and (c) after being cured to form a cured body;

(a) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;

(b) stiffness modulus in said rubbery state which is in the range of $10^5$ Pa to $10^7$ Pa; and (c) extensibility which cannot be destroyed even if said cured body is subjected to a shear deformation of 5% at a temperature of −50° C.

This invention further provides (3) an electronic material composition comprising at least powdery electronic material and a curable polymer, and exhibiting the following physical properties (d) and (e) after being cured to form a cured body;

(d) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.; and (e) stiffness modulus in said rubbery state which is in the range of $10^6$ Pa to $10^8$ Pa.

This invention further provides (4) an electronic material composition comprising at least powdery electronic material and a curable polymer, and exhibiting the following physical properties (d), (e) and (f) after being cured to form a cured body;

(d) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;

(e) stiffness modulus in said rubbery state which is in the range of $10^6$ Pa to $10^8$ Pa; and (f) extensibility which cannot be destroyed even if said cured body is subjected to a shear deformation of 2% at a temperature of −50° C.

This invention further provides (5) an electronic material composition according to any one of the aforementioned items (1) to (4), wherein the curable polymer comprises polysulfide-based polymer containing therein polysulfide rubber skeleton (—S—S—).

This invention further provides (6) an electronic material composition according to the aforementioned item (5), wherein the polysulfide-based polymer is polysulfide.

This invention further provides (7) an electronic material composition according to the aforementioned item (5), wherein the polysulfide-based polymer is polysulfide-modified epoxy polymer which is a reaction product between polysulfide and an epoxy compound.

This invention further provides (8) an electronic material composition according to any one of the aforementioned items (1) to (4), wherein the electronic material composition is adapted for use for forming an electronic component and formulated into a raw material for forming a body selected from the group consisting of a molded body, a packed body, a covering body, an electrode and a joining body.

This invention further provides (9) an electronic material composition according to any one of the aforementioned item (5), wherein the electronic material composition is adapted for use for forming an electronic component and formulated into a raw material for forming a body selected from the group consisting of a molded body, a packed body, a covering body, an electrode and a joining body.

This invention further provides (10) an electronic material composition according to any one of the aforementioned item (6), wherein the electronic material composition is adapted for use for forming an electronic component and formulated into a raw material for forming a body selected from the group consisting of a molded body, a packed body, a covering body, an electrode and a joining body.

This invention further provides (11) an electronic material composition according to any one of the aforementioned item (7), wherein the electronic material composition is adapted for use for forming an electronic component and formulated into a raw material for forming a body selected from the group consisting of a molded body, a packed body, a covering body, an electrode and a joining body.

This invention further provides (12) an electronic component comprising a body selected from the group consisting of a molded body, a packed body, a covering body, an electrode and a joining body as set forth in the aforementioned item (8).

This invention further provides (13) an electronic component according to the aforementioned item (12), wherein the molded body is a core of wound chip coil which can be obtained by means of molding, and the electronic component is a wound chip coil having said core.

This invention further provides (14) an electronic component according to the aforementioned item (12), wherein the covering body is an external packaging covering the winding of wound chip coil, and the electronic component is a wound chip coil having said external packaging.

This invention further provides (15) an electronic component according to the aforementioned item (12), wherein the covering body is an electromagnetic shielding covering body for a casing, and the electronic component is a casing for an electromagnetic component having said electromagnetic shielding covering body.

This invention further provides (16) an electronic component according to the aforementioned item (12), wherein the covering body is a cable sheath for preventing radiant noise, and the electronic component is a radiant noise-free cable having said cable sheath for preventing radiant noise.

This invention further provides (17) an electronic component according to the aforementioned item (12), wherein the covering body is an external packaging body for packaging mounted components on a printed wiring board, and the electronic component is a printed wiring board having said external packaging.

This invention further provides (18) an electronic component according to the aforementioned item (12), wherein the packed body is obtained by making use of an electromagnetic shielding caulking material as a filler for filling a gap between the electromagnetic shielding boards, panels or tiles, which are designed to form an electromagnetic shielding wall, and the electronic component is an electromagnetic shielding wall having said packed body.

This invention further provides (19) an electronic component according to the aforementioned item (12), wherein the electrode is an external electrode of a chip type electronic component, and the electronic component is a chip type electronic component having said electrode.

This invention further provides (20) an electronic component according to the aforementioned item (12), wherein the joining body is a conductive connecting body for connecting an external electrode of chip component with a soldering land of a printed wiring board, and the electronic component is a printed wiring board having said conductive connecting body.

This invention further provides (21) an electronic component according to the aforementioned item (12), wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

This invention further provides (22) an electronic component according to the aforementioned item (12), wherein the joining body is designed to connect a plurality of members, each member exhibiting a different linear expansion coefficient from one another, and the electronic component is an electronic component having said plurality of members which are connected through said joining body.

This invention further provides (23) an electronic component comprising a body selected from the group consisting of a molded body, a packed body, a covering body, an electrode and a joining body as set forth in the aforementioned item (10).

This invention further provides (24) an electronic component according to the aforementioned item (23), wherein the molded body is a core of wound chip coil which can be obtained by means of molding, and the electronic component is a wound chip coil having said core.

This invention further provides (25) an electronic component according to the aforementioned item (23), wherein the covering body is an external packaging covering the winding of wound chip coil, and the electronic component is a wound chip coil having said external packaging.

This invention further provides (26) an electronic component according to the aforementioned item (23), wherein the covering body is an electromagnetic shielding covering body for a casing, and the electronic component is a casing for an electromagnetic component having said electromagnetic shielding covering body.

This invention further provides (27) an electronic component according to the aforementioned item (23), wherein the covering body is a cable sheath for preventing radiant noise, and the electronic component is a radiant noise-free cable having said cable sheath for preventing radiant noise.

This invention further provides (28) an electronic component according to the aforementioned item (23), wherein the covering body is an external packaging body for packaging mounted components on a printed wiring board, and the electronic component is a printed wiring board having said external packaging.

This invention further provides (29) an electronic component according to the aforementioned item (23), wherein the packed body is obtained by making use of an electromagnetic shielding caulking material as a filler for filling a gap between the electromagnetic shielding boards, panels or tiles, which are designed to form an electromagnetic shielding wall, and the electronic component is an electromagnetic shielding wall having said packed body.

This invention further provides (30) an electronic component according to the aforementioned item (23), wherein the electrode is an external electrode of a chip type electronic component, and the electronic component is a chip type electronic component having said electrode.

This invention further provides (31) an electronic component according to the aforementioned item (23), wherein the joining body is a conductive connecting body for connecting an external electrode of chip component with a soldering land of a printed wiring board, and the electronic component is a printed wiring board having said conductive connecting body.

This invention further provides (32) an electronic component according to the aforementioned item (23), wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

This invention further provides (33) an electronic component according to the aforementioned item (23), wherein the joining body is designed to connect a plurality of members, each member exhibiting a different linear expansion coefficient from one another, and the electronic component is an electronic component having said plurality of members which are connected through said joining body.

This invention further provides (34) an electronic component comprising a body selected from the group consisting of a molded body, a packed body, a covering body, an electrode and a joining body as set forth in the aforementioned item (11).

This invention further provides (35) an electronic component according to the aforementioned item (34), wherein the molded body is a core of wound chip coil which can be obtained by means of molding, and the electronic component is a wound chip coil having said core.

This invention further provides (36) an electronic component according to the aforementioned item (34), wherein the covering body is an external packaging covering the winding of wound chip coil, and the electronic component is a wound chip coil having said external packaging.

This invention further provides (37) an electronic component according to the aforementioned item (34), wherein the covering body is an electromagnetic shielding covering body for a casing, and the electronic component is a casing for an electromagnetic component having said electromagnetic shielding covering body.

This invention further provides (38) an electronic component according to the aforementioned item (34), wherein the covering body is a cable sheath for preventing radiant noise, and the electronic component is a radiant noise-free cable having said cable sheath for preventing radiant noise.

This invention further provides (39) an electronic component according to the aforementioned item (34), wherein the covering body is an external packaging body for packaging mounted components on a printed wiring board, and the electronic component is a printed wiring board having said external packaging.

This invention further provides (40) an electronic component according to the aforementioned item (34), wherein the packed body is obtained by making use of an electromagnetic shielding caulking material as a filler for filling a gap between the electromagnetic shielding boards, panels or tiles, which are designed to form an electromagnetic shielding wall, and the electronic component is an electromagnetic shielding wall having said packed body.

This invention further provides (41) an electronic component according to the aforementioned item (34), wherein the electrode is an external electrode of a chip type electronic component, and the electronic component is a chip type electronic component having said electrode.

This invention further provides (42) an electronic component according to the aforementioned item (34), wherein the joining body is a conductive connecting body for connecting an external electrode of chip component with a soldering land of a printed wiring board, and the electronic component is a printed wiring board having said conductive connecting body.

This invention further provides (43) an electronic component according to the aforementioned item (34), wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

This invention further provides (44) an electronic component according to the aforementioned item (34), wherein the joining body is designed to connect a plurality of members, each member exhibiting a different linear expansion coefficient from one another, and the electronic component is an electronic component having said plurality of members which are connected through said joining body.

This invention further provides (45) a method of using an electronic material composition, which comprises the steps of; forming an electronic component having a semi-cured state of a molded body, a packed body, a covering body, an electrode or a joining body by making use of the electronic material composition of any one of the aforementioned items (1) to (4); and completely curing the molded body, the packed body, the covering body, the electrode or the joining body to obtain the electronic component having a cured state of the molded body, the packed body, the covering body, the electrode or the joining body.

This invention further provides (46) a method of using an electronic material composition, which comprises the steps of; forming an electronic component having a semi-cured state of a molded body, a packed body, a covering body, an electrode or a joining body by making use of the electronic material composition of the aforementioned item (6); and completely curing the molded body, the packed body, the covering body, the electrode or the joining body to obtain the electronic component having a cured state of the molded body, the packed body, the covering body, the electrode or the joining body.

This invention further provides (47) a method of using an electronic material composition, which comprises the steps of; forming an electronic component having a semi-cured state of a molded body, a packed body, a covering body, an electrode or a joining body by making use of the electronic material composition of the aforementioned item (7): and completely curing the molded body, the packed body, the covering body, the electrode or the joining body to obtain the electronic component having a cured state of the molded body, the packed body, the covering body, the electrode or the joining body.

The electronic material composition according to this invention may be either a mixture comprising a resin component, to which powdery electronic materials such as powdery ferrite, powdery electric conductor and a functional filler such as a powdery filler are mixed together, or a mixture comprising a resin component, to which such powdery electronic materials are not mixed together. The former mixture can be employed, by optionally selecting a suitable kind of powdery electronic materials, as a coating material, a molding material, an electrode material, a joining material or a filler. Even in the case of the latter mixture, it may be employed as any of the aforementioned materials, for example as a packaging material for a wound chip coil. In any case, it is desirable that these resinous material compositions have the following physical properties.

First of all, in the case of the resinous material composition containing no powdery electronic material, the cured product thereof should desirably be provided with the following features (a) and (b).

(a) Temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.; and (b) stiffness modulus in said rubbery state which is in the range of $10^5$ Pa to $10^7$ Pa.

With respect to the stiffness modulus in relative to temperature, the rate of change thereof is relatively large especially in the process of being shifted from a glassy state to a rubbery state. Therefore, due to this large rate of change, it can be distinguished from the glassy state or the rubbery state where the rate of change is relatively small. The glass transition temperature is located within the range of temperature which corresponds to the variation curve exhibiting a large rate of change and can be represented by Tg.

In terms of dynamic viscoelasticity, the storage elastic modulus (G') representing the magnitude of the elasticity characteristics of polymer generally decreases as the temperature increases. In the case, while the G' of thermoplastic resin continues to decrease even in the rubber region thereof, the G' of cross-linking type polymer keeps to remain the same level or increases in the rubber region thereof without further decreasing. On the other hand, the relationship between temperature and the dynamic loss modulus (G'') representing the magnitude of viscosity characteristics of polymer can be shown by a curve having a maximal point. Further, dynamic loss (loss tangent) tan δ (δ is a phase angle (a phase difference between stress and strain vector)) can be measured from a phase difference between stress and the simple harmonic oscillation of strain, thereby making it possible to assume the dynamic loss as a scale indicating the degree of loss, due to the generation of heat, of dynamic energy received by the system. However, the temperature indicating the peak value of tan δ in the curve G'' would become Tg (glass transition temperature) of dynamic measurement, this peak value may be assumed as the aforementioned glass transition temperature Tg. This Tg value can be made higher by increasing the crosslinking density or by designing a polymer which is high in nuclear structural concentration such as phenyl nucleus. This Tg value can be also made lower by loosening the crosslinking density, by introducing an alkyl chain of fatty acid into the polymer, or by mixing a plasticizer into the polymer. The details on these matters can be found in a document "The Latest Pigment Dispersion Technology", 1993, Technological Information Association, pp 53–54, para 2.1, which is incorporated herein for reference.

With regard to the aforementioned features (a) and (b), in the case of the cured product of epoxy resin that has been conventionally employed in the fields of electronic material, the Tg thereof is generally higher than 50° C. and the stiffness modulus in the rubbery state is also higher than $10^8$Pa. On the other hand, the ordinary crosslinked rubber exhibiting a large elasticity is generally extremely low in Tg, i.e. not less than twice lower than −50° C. Whereas this invention is featured in the employment of an electronic material having the aforementioned features of not only (a) but also (b), which features are not found in the conventional electronic material. As a result, it is possible according to this invention to provide an electronic material excellent in flexibility, toughness and resistivity to thermal stress. By the way, the resin component to be employed in this invention is curable and hence can be distinguished from thermoplastic resin. If the value of Tg is too large, the toughness of the electronic material as it is placed under a condition where there is a prominent difference in temperature as in the case of the aforementioned reflow soldering test would be badly deteriorated. On the other hand, if the value of Tg is too small, the density of crosslinking would become low and hence become poor in heat resistance. Further, if the stiffness modulus is too large, the relaxation of thermal stress or mechanical stress would be badly deteriorated, while if the stiffness modulus is too small, the shape retention would be deteriorated.

As explained above, the resinous material composition to be employed in this invention can be distinguished from other conventional resinous material compositions in the respect that it is provided with the aforementioned features (a) and (b). It is also possible to further distinguish the resinous material composition of this invention from the conventional ones by further providing it with the following feature (c).

(c) Extensibility which cannot be destroyed even if a cured body is subjected to a shear deformation of 5% at a temperature of −50° C.

This feature (c) illustrates the absorbency of external force, which enables to absorb an external force without giving rise to the fracture of cured product. In the case of the cured product of epoxy resin that has been conventionally employed in the fields of electronic material, a fracture is caused to occur as the cured product is subjected to a shear deformation of 5% at a temperature of −50° C. Therefore, the conventional cured product of epoxy resin can be much more distinguished from the resinous material composition of this invention in this feature (c) rather than the aforementioned feature (b).

As for the resinous material composition which meets the aforementioned various characteristics, a resinous material composition comprising, as a main component, polysulfide-based polymer can be exemplified. It is of course possible to employ other kinds of resinous material composition.

This polysulfide-based polymer may be a polymer having a polysulfide rubber skeleton (—S—S—) in its molecule, a polymer comprising, as a main component, polysulfide having a large number of sulfide groups, or a polysulfide polymer itself. This polysulfide can be represented by the general formula, HS—( . . . —SS)n . . . —SH (wherein ". . ." is an organic group having a skeleton comprising a sulfide bond, a carbon-carbon bond, an ether bond, etc.; and n is an integer including zero), and is capable of bringing about a dehydration reaction in the presence of oxygen as shown below, the dehydration reaction taking place at the terminal portion of each polysulfide molecule for instance. Further, in the presence of oxidizer, the polysulfide may be formulated into a cold-setting polymer.

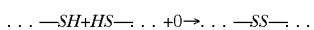

As for the molecule of polysulfide, the following molecule can be exemplified specifically.

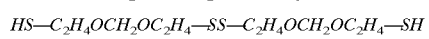

This specific compound is known and employed as a component for a caulking material for building, and some kinds of this compound is placed on the market.

This polysulfide-based polymer may be a reaction product between polysulfide and a component of other kind of polymer or compound, or may be made curable by introducing epoxy group or other kinds of reactive functional group.

As for polysulfide modified epoxy resin consisting of a polysulfide modified epoxy polymer which is a reaction product between the aforementioned polysulfide and an epoxy compound, a resin consisting of a polymer to be obtained through a reaction between thiol group (—SH) and epoxy group can be exemplified. For example, a resin consisting of a straight-chain high-molecular weight compound to be obtained from the reaction shown in the following general formula (1) for instance and having a weight average molecular weight of 1000 to 22000 can be exemplified. It is also possible to exemplify a resin consisting of a straight-chain high-molecular weight compound comprising, as a fundamental skeleton, a reaction product to be obtained from the reaction shown in the following general formula (1), polysulfide polymer attached to epoxy groups formed respectively at both ends of the skeleton, and epoxy polymer attached to the terminal thiol group of the polysulfide polymer, said straight-chain high-molecular weight compound having a weight average molecular weight of 1000 to 22000, wherein the equivalent ratio formulated of the polymer components is adjusted such that the terminal group of said straight-chain high-molecular weight compound to be ultimately formed through the repetition of the polymerization thereof is constituted by epoxy group.

polysulfide-modified epoxy polymer having epoxy group at one end of the polymer as well as other portion of polymer can be cured by using them together with a curing agent. Whereas when a latent curing agent (a curing agent which is hardly capable of functioning as a curing agent at ordinary temperature but is capable of functioning as a curing agent upon heating) is employed together with these polymers, a molded product or coated film consisting of a cured resin can be obtained while maintaining the same workability as the ordinary coating material.

Polysulfides such as polysulfide polymer, epoxy compounds, the aforementioned polysulfide-modified epoxy polymer and other polysulfide-modified curable polymer where a reactive compound other than epoxy compound is employed can be formed, singly or in combination of two or more kinds, into a curable resin composition for electronic materials together with, if required, at least one kind of additive selected from the group consisting of other kinds of curable polymer, non-curable polymers including rubber, curing agents such as latent curing agents, fillers and coupling agents. The curable resin composition thus formulated can be employed for obtaining a cured molded product or coated film. It is possible, in this case also, to combine a greatly extensible skeleton with a slightly extensible skeleton as shown in FIG. 1.

As for the curing agent, it is possible to employ imidazole type amine adducts, straight chain type dicarbohydrazide, etc. Specific examples of the curing agent include PN—H and MY—H (trademark, Ajinomoto Co., Ltd.).

The cured film containing as a main component the aforementioned polysulfide-based polymer exhibits a Tg value which is the same with or lower than that of the cured film of silicone resin which is known as being excellent in

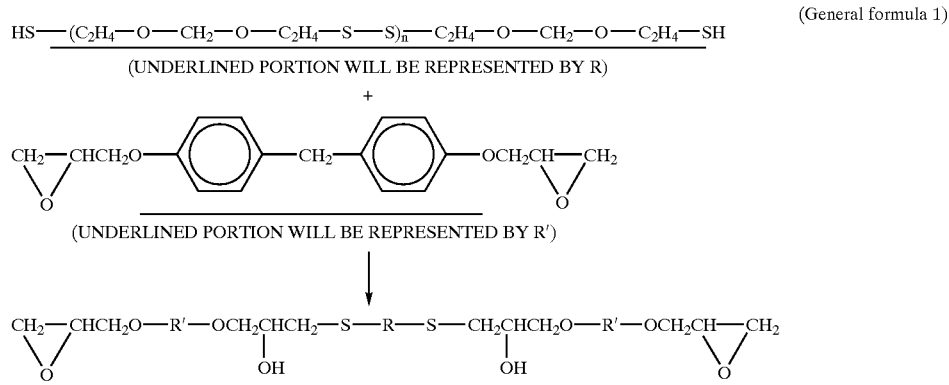

(General formula 1)

(wherein R represents a residual group to be derived by removing both terminal groups from polysulfide polymer, i.e. —($C_2H_4$—O—$CH_2$—O—$C_2H_4$—S—S)n—$C_2H_4$—O—$CH_2$—O—$C_2H_4$—; and R' is $C_6H_4$—$CH_2$—$C_6H_4$— (wherein $C_6H_4$ is benzene ring)

The reaction components and the extensibility of product are schematically shown in FIG. 1 (R and R' of the general formula 1 are also shown therein).

Specific examples of epoxy compound useful in this case are bisphenol type epoxy resins such as bisphenol A-type epoxy resin, bisphenol F-type epoxy resin (both, Dai-Nippon Ink Chemical Industries Co., Ltd.), Eposet (BPA328) and Eposet (BPF307) (both, Nihon Shokubai Co., Ltd.).

Not only the aforementioned reaction product having epoxy group on both ends, but also a resin consisting of flexibility, and also exhibits the same degree or a lower degree of relaxation to thermal stress when it is employed as a joining material or as an electrode material as compared with the known cured film of silicone resin. Even in the comparison with the cured film of epoxy resin, the cured film containing as a main component the aforementioned polysulfide-based polymer is comparable thereto or more excellent in terms of solvent resistance, chemical resistance and heat resistance of the adhesive power thereof to a metal, etc. For instance, the cured film containing as a main component the aforementioned polysulfide-based polymer is allowed to be barely oxidized when it is heated to a temperature higher than 230° C.

As compared with silicone resin, the curing of the resinous material composition containing the aforementioned polysulfide can be more easily controlled by adjusting the quantity of oxygen to be supplied. Further, the degree of curing of polysulfide-based polymer having epoxy group introduced therein can be also easily controlled, so that the polymer in the B-stage thereof, i.e. in a semi-cured state thereof (irrespective of whether or not the quantity of curing is larger or smaller than a half thereof) can be employed for covering or filling an object in conformity with the specific configuration of the object. Thus, even if the object has an odd-shaped portion, the polymer can be applied and then completely cured so as to conform with the shape of the object.

As explained above, the resinous material composition containing the aforementioned polysulfide is provided with features which are comparable to those of the silicone resin and epoxy resin, and is also excellent in adaptability in the use thereof. Further, this resinous material composition can be employed together with these silicone resin and epoxy resin, thereby allowing the polysulfide or other kinds of polysulfide-based polymer to be reacted with the polymers of these resins. Alternatively, in addition to the co-use thereof together with silicone resin and/or epoxy resin, this resinous material composition can be employed together with other components so as to obtain a material satisfying the aforementioned physical features (a) and (b), or (a) to (c).

The aforementioned polysulfide-based polymer or a mixture thereof with other kinds of polymer component may be formulated together with a solvent including an epoxy-containing reactive diluent or other non-reactive solvent, thereby enabling the resinous material composition per set to be used as an electronic material composition. Alternatively, the resinous material composition may be mixed with a powdery electronic material, the examples of which include a magnetic material such as powdery ferrite; a conductive powder such as metallic powder (such as silver powder and copper powder) and carbon powder; and a functional filler such as a packing material, thereby obtaining an electronic material composition such as a conductive material composition or a magnetic material composition.

If the aforementioned polysulfide-based polymer or a mixture thereof with other kinds of polymer component is to be employed as a mixture thereof with a powdery magnetic material, 0 to 60% by volume of the powdery magnetic material can be mixed with 40 to 100% by volume of the polysulfide-based polymer or a mixture thereof with other kinds of polymer component to obtain a magnetic material composition which may further contain, if required, other kinds of resin, a solvent or other kinds of additive. As for the powdery magnetic material, various kinds of ferrite power can be employed. On the other hand, if the aforementioned polysulfide-based polymer or a mixture thereof with other kinds of polymer component is to be employed as a mixture thereof with a powdery conductive material, 0 to 60% by volume of the powdery conductive material can be mixed with 40 to 100% by volume of the polysulfide-based polymer or a mixture thereof with other kinds of polymer component to obtain a conductive material composition which may further contain, if required, other kinds of resin, a solvent or other kinds of additive. As for the powdery conductive material, a metallic powder composed of silver, copper, aluminum, etc. or carbon black can be employed. It is also possible in this case to employ fullerene (C60 or C70 type carbon). By the way, the aforementioned expression of: "0 to 60% by volume" may be replaced by the expression of: "not more than 60% by volume". The same substitution of expression can be also applied to where the expression of "0 to - - -" is referred to hereinafter.

The physical properties of cured products of an electronic material composition including the aforementioned magnetic material composition, conductive material composition and other kinds of material compositions to be obtained in the same manner as those of the aforementioned magnetic or conductive material composition are required to have the following features.

(d) Temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.; and (e) stiffness modulus in said rubbery state which is in the range of $10^6$Pa to $10^8$Pa.

As explained above, the resinous components to be employed in this invention can be distinguished from the conventional resinous material compositions employing other resinous components in the respect that it is provided with the aforementioned features (d) and (e). It is also possible to further distinguish the resinous material composition of this invention from the conventional ones by further providing it with the following feature (f).

(f) Extensibility which cannot be destroyed even if a cured body is subjected to a shear deformation of 2% at a temperature of −50° C.

The meanings of terms as well as the functions of features related to these features (d) to (f) are the same as described with reference to the aforementioned features (a) to (c).

It is possible, through the employment of such an electronic material composition, to provide a material for electronic parts or electronic products, which is capable of exhibiting an excellent effect which the conventional materials have failed to provide.

For example, by adjusting the quantity of a curing agent to be employed so as to reduce the inter-crosslinking point density representing one of the physical properties of cured product, or by increasing the ratio of polysulfide rubber skeleton occupying the skeleton of polymer so as to adjust the entanglement of rubber molecule chain, the glass transition temperature can be lowered and at the same time, excellent breaking extension property can be ensured while retaining a low stiffness modulus. As a result, it is now possible to simultaneously realize not only the reduction of residual stress at the moment of curing a resin, but also the relaxation of stress that has been generated by heat load.

Specifically, if the aforementioned magnetic material composition is to be employed as a packaging material to be applied to the winding of a wound chip coil, it is possible to reduce the quantity of volatilization of solvent or to make solvent-free thereby making it possible to reconsider the drying step as a curing condition of resin and at the same time, the glass transition temperature representing one of the physical properties of curable resin can be lowered, or the residual stress to be generated prominently at a temperature of not higher than the glass transition temperature can be minimized, thereby making it possible to reduce the residual stress at the moment of initial curing as well as at the moment of cooling. Further, owing to the lowering of glass transition temperature, the reduction of stiffness modulus (the reduction of stress generated) and the improvement of elastic limit elongation percentage (the absorption of stress generated at a temperature of not higher than the glass transition temperature), it is now possible to reduce or absorb the stress generated at the moment of the repetition of heat load. As a result, the generation of peel-off of packing material from the core or of cracking of packing material can be inhibited.

The aforementioned solvent-free can be realized by making use of a reactive diluent such as an epoxy-containing solvent for instance. The lowering of glass transition temperature can be realized by reducing the crosslinking density and by increasing the entanglement of molecule by long molecular chains. For the purpose of lowering the stiffness modulus of the cured product in a state of glass, a modified silicone oil for instance may be co-used as a flexibilizer. By making use of these additives, the glass transition temperature can be lowered to not higher than the normal temperature (25° C.), the breaking extension percentage can be increased to 5% or more (even if a powdery electronic material such as ferrite powder for instance is added at a ratio of 50% by volume), the composition can be made solvent-free, and the Young's modulus of the cured product in a state of glass can be reduced to about a half of the current volume products.

As for the method of increasing the breaking extension percentage, the modification of physical properties of cured product may be performed making use of a main component. Specifically, it is preferable, for this purpose, to employ polysulfide-modified epoxy polymer that can be derived from a reaction between the aforementioned epoxy resin and polysulfide polymer.

When the core of wound chip coil is molded by means of injection molding by making use of the aforementioned magnetic material composition, it is possible to obtain the core which is excellent in reflow solderability and in toughness to shock, and to increase, in conformity with the flexibility of polymer, the filling quantity of ferrite which influences the electric property of the core. Therefore, it is possible to obtain the core without necessitating the cutting work or with so-called work-less, while enabling the degree of freedom in configuration to be realized, enabling the miniaturization of the core to be realized, and enabling the high-functionalization of the core to be realized without necessitating high precision and with high yield. As a result, it is possible to obtain a wound chip coil of high performance at low cost, which the prior art has failed to realize.

The absorption of stress due to a difference in thermal expansion coefficient of the resin for packaging as well as the improvement in shock resistance in conformity with an increase in fineness of chip can be realized as mentioned above by decreasing the elastic modulus of resin, by lowering the glass transition temperature, by increasing the elongation percentage, thereby lowering the residual stress and relaxing the stress thus generated.

Further, when the aforementioned magnetic material composition or resin material composition is employed as a packaging material for covering the winding wound around the core of wound chip coil, a portion of the packaging material of the wound chip coil, on which the adsorption nozzle of a mounter is designed to be adsorbed, is constituted by a flexible polymer component exhibiting a low elastic modulus, so that the packaging material is enabled to be deformed in conformity with the configuration of the contacting surface of adsorption nozzle, thereby scarcely allowing a gap to be formed therebetween. As a result, no slipage can be caused to generate between the nozzle and the packaging material, thus making it possible to minimize the failure of mounting. After the mounting of the chip coil, the packaging material is allowed to restore to the original configuration without inviting no disadvantage as far as the external configuration of the chip coil is concerned.

Further, when the aforementioned magnetic material composition or resin material composition is employed for covering the walls of casing, an electromagnetic shielding layer which is capable of shielding electromagnetic waves from outside which may give an influence to electronic parts mounted inside the casing and hence capable of preventing the generation of noise can be formed. In this case, when the magnetic material composition is formed into a gel-like or putty-like state by making use of a semi-cured polymer component as it is employed for coating the casing and subsequently cured, the workability thereof can be greatly improved as compared with the case where completely uncured polymer is made use of. Irrespective of whether a semi-cured polymer is employed or a completely uncured polymer is employed, the magnetic material composition is formed at first into a sheet by casting it on a releasable film or by extrusion-molding it, and the resultant sheet is then adhered onto the casing (body to be covered with) under heating. In either cases, a troublesome operation of injection-molding an electromagnetic shielding sheet as in the case of the prior art can be omitted, and at the same time, since the polymer employed herein is low in elastic modulus and flexible, the magnetic material composition employing this Polymer can be employed to form an electromagnetic shielding sheet layer for the casing, which is capable of suitably conforming to an odd-shaped surface, of closely adhering to the casing, and of resisting repeated exposures to a difference in temperature of cold and hot.

Irrespective of whether this magnetic material composition is employed as a packaging material or as a covering material, this magnetic material composition is capable of exhibiting an excellent stress relaxation property against the thermal stress to be generated when these materials are placed under a condition where temperature is differentiated.

In the employment of the magnetic material composition as a covering material for the lead wire of cable, the magnetic material composition may be extrusion-molded together with the lead wire, or may be coated on the covering layer of the conventional cable or extrusion-molded together with the covering layer of the conventional cable. It is also possible in this case to provide a cable having a covering layer where the polymer component is low in elastic modulus and flexible, and which is capable preventing radiation noise.

In the employment of the magnetic material composition as an outer electrode material for electronic parts, a conductive material paste consisting of the magnetic material composition is coated on the electronic parts, and then the resultant film is baked. The outer electrode thus formed is then applied on the surface thereof with a copper plating or a nickel plating, after which the resultant electronic parts can be mounted on a printed wiring board by means of soldering. Since the polymer component is flexible, and the skeleton thereof is provided with rubber elasticity in this case also, the outer electrode material is excellent in stress relaxation and in reflow solderability, thereby making it possible to improve the durability of the electronic parts mounted on the printed wiring board. It is preferable that the outer electrode material is provided with the same properties as those of the aforementioned packaging material for wound coil.

In this case, instead of soldering the outer electrode, the aforementioned conductive material paste may be coated either on the aforementioned outer electrode or an outer electrode consisting of the conventional material, or on the soldering land of the printed wiring board, and then heated to form a cementing material for electronic parts. Heating condition in this case may be such that heating may be performed in the range of ordinary temperature to 160° C. for several minutes to 20 minutes. Namely, the curing of this conductive material paste can be performed at a lower temperature as compared with the conventional soldering paste using a rosin-based material, thereby making it possible to minimize the damage to the other mounted parts on the printed wiring board, that might be caused due to the heating temperature.

Furthermore, when a cementing material to be obtained from an electronic composition comprising a resin material composition having the aforementioned features (a) and (b), or (a) to (c), or a powdery filler having the aforementioned features (d) and (e), or (d) to (f) is interposed between a green sheet laminate corresponding to an inductor portion and a green sheet laminate corresponding to a condenser portion of LC laminate composite electronic parts, it is possible, owing mainly to the low elastic modulus or flexibility of the polymer component, to relieve a stress that may be generated due to a difference in shrinkage factor between these green sheet laminates on the occasion of baking, thereby making it possible to prevent cracks from generating in the resultant baked body.

Further, when a green sheet laminate corresponding to an inductor portion and a green sheet laminate corresponding to a condenser portion are prepared in advance, and then bodies to be cemented and differing in expansion coefficient are bonded together by making use of an electronic material composition as in the case of the LC element which has been bonded by making use of an electronic material composition having the aforementioned features (d) and (e), or (d) to (f), it is possible to obtain electronic parts exhibiting relaxativity to a thermal stress even if the electronic parts are placed under a condition where temperature is differentiated.

Additionally, when the aforementioned magnetic material composition is employed as a caulking material for filling a joint portion of electromagnetic shielding board or tile constituting the external wall of building, it is possible to improve the heat resistance, weatheability and electromagnetic shielding effect of the joint portion without generating cracks owing to the low elastic modulus or flexibility of the polymer component even if the joint portion is exposed to a repeated difference in temperature of cold and hot. On this occasion, since the caulking material can be cured at the ordinary temperature, it is also convenient in this respect.

As explained above, the electronic material composition of this invention can be used for various end-use. For example, as mentioned above, the polymer component can be employed in a semi-cured state as in the cases of applying it for extrusion-molding the electromagnetic shielding layer of casing or for extrusion-molding the cover or skin of cable. However, in addition to these end-uses, the polymer component can be employed in a semi-cured state for other end-uses in the same manner as mentioned above. Namely, by controlling the heating temperature or heating time, it is possible to prevent electronic parts of electronic products from being damaged due to heating and to obtain other advantages.

DETAILED DESCRIPTION OF THE INVENTION

The electronic material composition according to this invention is applicable to electronic products such as electronic parts, so that this invention is also related to electronic products. This invention is also designed to provide a method of using this electronic material composition. The details of this invention will be further explained with reference to the following examples, wherein one example of this electronic product is shown in FIGS. 2 to 6.

Figure 1:
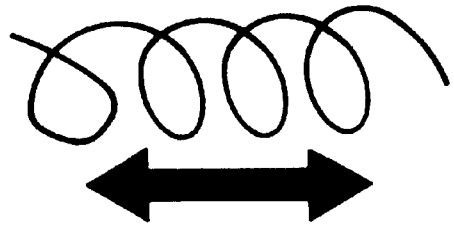
FIG. 1 is a schematic-view illustrating a relationship between the process of obtaining polysulfide-modified epoxy polymer.
Figure 1:
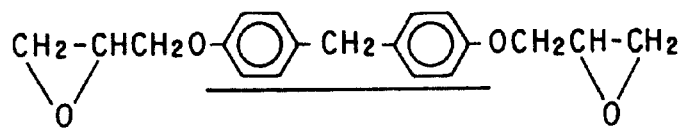
Figure 1:
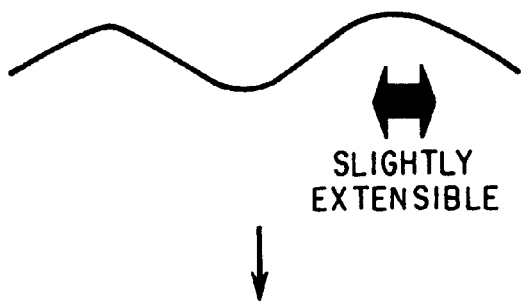
Figure 1:
Figure 1:
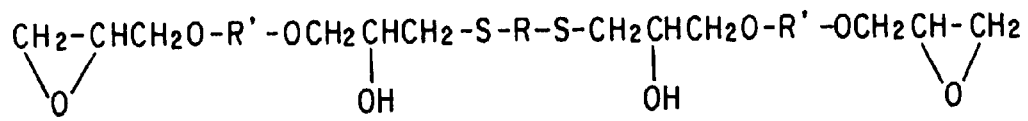
Figure 1:
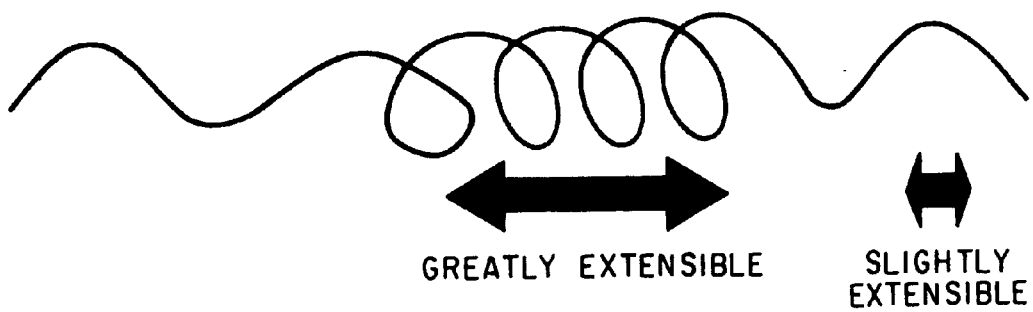
Figure 2:
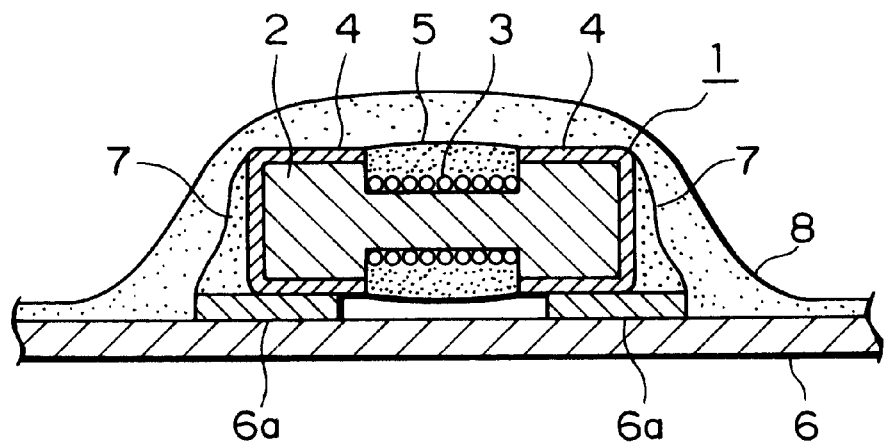
FIG. 2 is a cross-sectional view of a portion of electronic parts mounted on a printed wiring board according to a first example representing one of electronic products of this invention.

Referring to FIG. 2, the reference number 1 is a wound chip coil comprising a core 2 having flange portions formed respectively at both ends thereof, a winding 3 wound around a central recessed portion of the core 2, outer terminal electrodes 4 attached respectively to both flange portions of the core 2, and a packaging body 5 made of a covering material and formed over the winding 3. This wound chip coil 1 is bonded, through the electrodes 4, on the soldering lands 6a of circuit pattern 7 of a printed wiring board 6 by making use of a cementing body 7 made of a cementing material.

Though not shown in the drawings, other kinds of chip are also mounted on predetermined soldering lands in the same manner as explained above. Further, a covering body 8 is formed all over the printed wiring board 6 including these parts.

Figure 3:
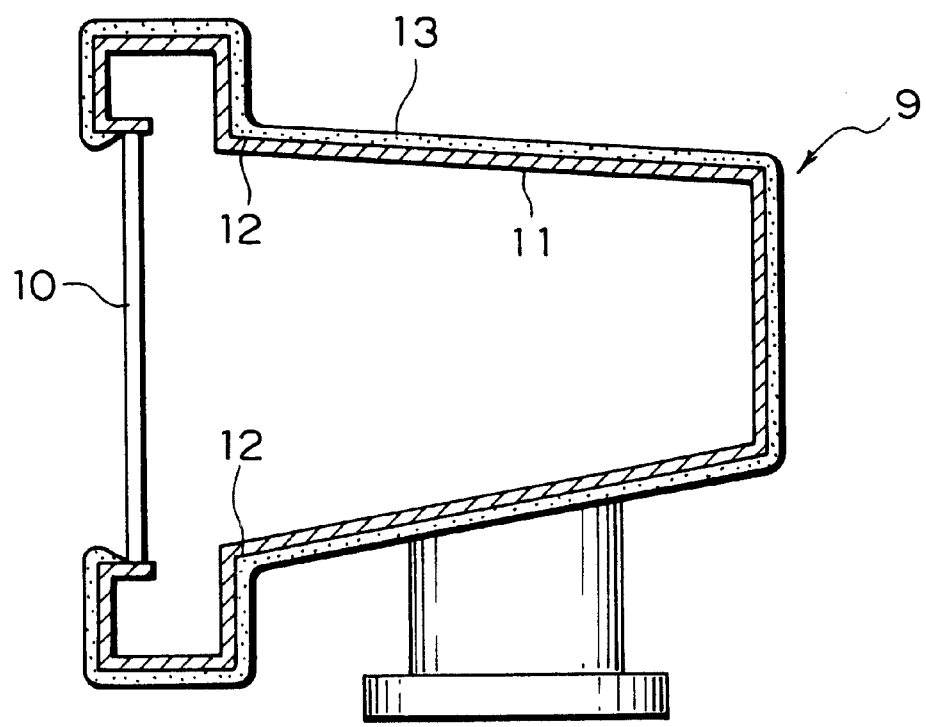
FIG. 3 is a cross-sectional view of a casing according to a second example representing one of electronic products of this invention.

As shown in FIG. 3, the reference numeral 9 represents an electromagnetic shielding casing which comprises a display portion 10, a main body 11 in which other electronic parts are designed to be disposed, a stepped portion 12 formed between the display portion 10 and the main body 11, and a covering body constituted by an electromagnetic shielding layer 13 formed all over the external wall of the casing.

Figure 4:
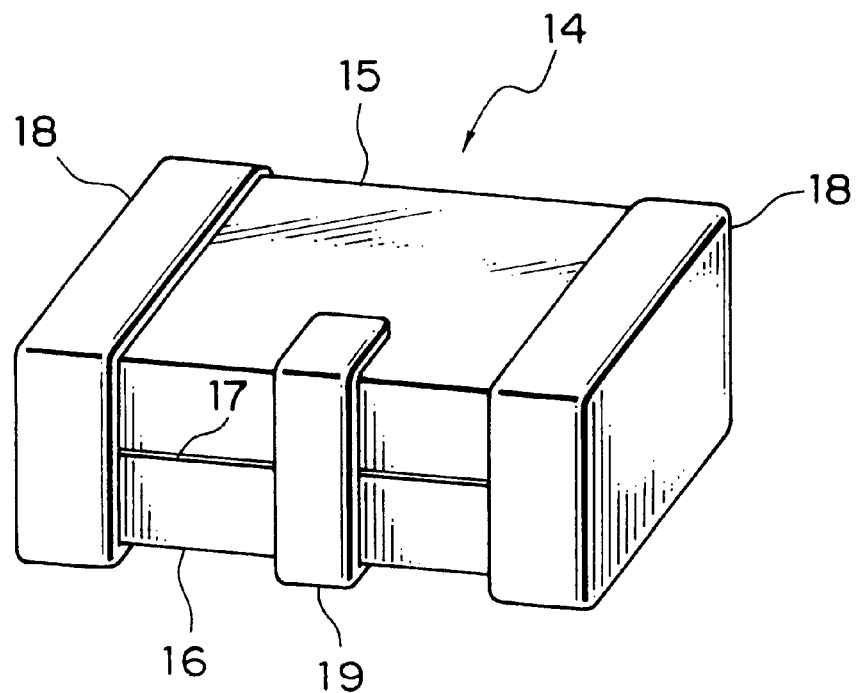
FIG. 4 is a perspective view of an LC laminate composite electronic part according to a third example representing one of electronic products of this invention.

Further, referring to FIG. 4, the reference numeral 14 represents an LC laminate composite electronic part which comprises a condenser portion 15, an inductor portion 16, a cementing body 17 interposed between the condenser portion 15 and the inductor portion 16, outer terminal electrodes 18 formed on both sides of the composite electronic part, and an earth side outer terminal electrode 19 of the condenser which is disposed at the central portion of the composite electronic part.

Figure 5:
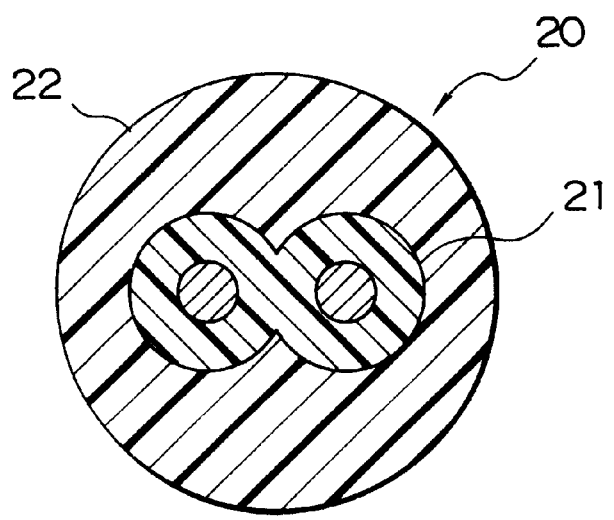
FIG. 5 is a cross-sectional view of a radiation noise-preventing cable according to a fourth example representing one of electronic products of this invention.

Further, referring to FIG. 5, the reference numeral 20 represents a radiation noise preventing cable which comprises a covered conductor 21 and a skin 22 formed on the external circumference of the cable.

Figure 6:
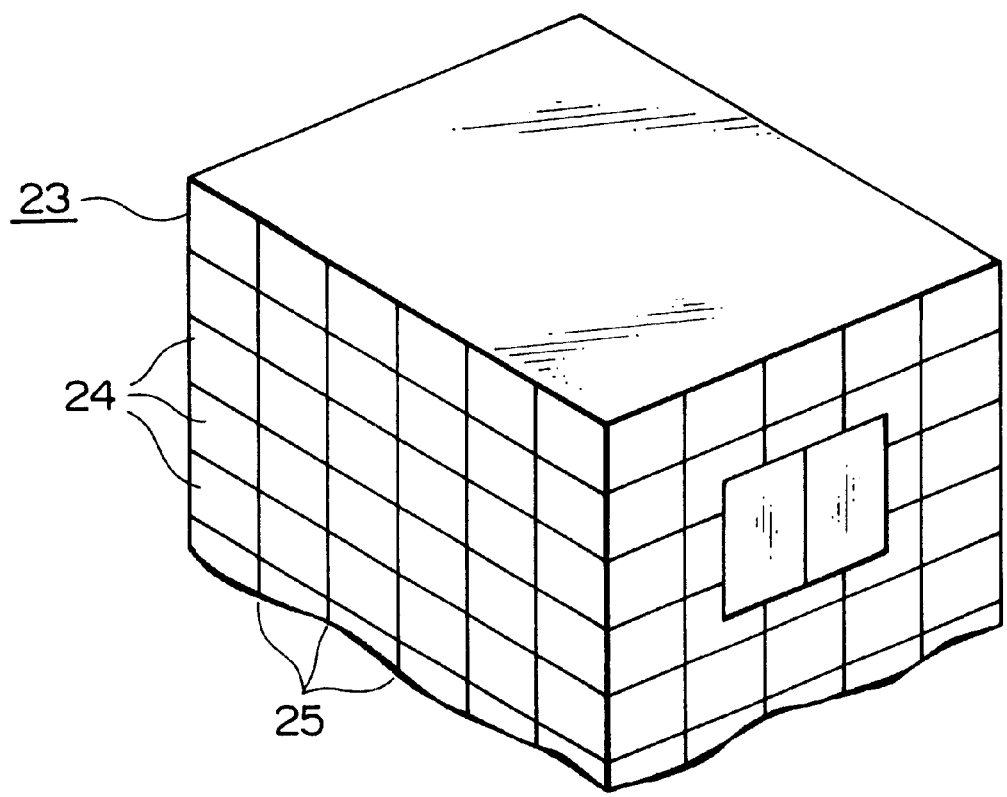
FIG. 6 is a perspective view of a portion of the external wall of building according to a fifth example representing one of electronic products of this invention.

Further, referring to FIG. 6, the reference numeral 23 represents an external wall of building which is constituted by electromagnetic shielding boards, panels or tiles 24, and a filler 25 formed of an electromagnetic shielding caulking material and filled at the joint portion of the electromagnetic shielding boards, panels or tiles 24.

A magnetic material composition comprising a polymer component consisting of polysulfide-based polymer or of polysulfide-based polymer and epoxy resin, powdery magnetic material such as ferrite, and other permissible various kinds of additive can be employed as a molding material for the core 2 or as a covering material for forming the electromagnetic shielding layer 13 of the electromagnetic shielding casing 9. Namely, this magnetic material composition can be injection-molded to form the core 2 or used as it is after dissolving it in a solvent to obtain a fluid composition for forming the electromagnetic shielding layer 13. Alternatively, the polymer component may be heated in air atmosphere for instance so as to make it a semi-cured state, the resultant gel-like or putty-like composition being subsequently applied under heating to all over the external wall of the casing.

A fluid resinous material composition comprising a polymer component consisting of polysulfide-based polymer or of polysulfide-based polymer and epoxy resin, and other various kinds of additive can be employed as a covering material for forming the packaging body 5 for the winding 3 of the wound chip coil or as a cementing material for forming the cementing body 17 of LC laminate composite electronic part 14. Namely, the packaging body 5 can be formed by pouring the fluid resinous material composition over the winding 3 by making use of a tubular body. As for the cementing body 17, a green sheet is manufactured in advance, and the resultant green sheet is placed between a green sheet laminate of the condenser portion 15 and a green sheet laminate of the inductor portion 16, and then baked while keeping these green sheet laminates in a press-contacted state. In this case, the aforementioned magnetic material composition may be also employed in the same manner.

Alternatively, these green sheet laminates maybe separately baked and then bonded to each other by making use of the aforementioned cementing material consisting of the resinous material composition, the green sheet laminates thus bonded being allowed to cure to obtain an LC element, which is subsequently processed in the same manner as illustrated with reference to FIG. 3, thereby obtaining the LC laminate composite electronic part.

A fluid conductive material composition comprising a polymer component consisting of polysulfide-based polymer or of polysulfide-based polymer and epoxy resin, powdery conductive material such as metallic powder, and a solvent as one of other various kinds of additive can be employed for forming the outer terminal electrodes 4 of the wound chip coil or for forming the outer terminal electrodes 18 and 19 of LC laminate composite electronic part 14. Namely, the fluid conductive material composition can be coated on a predetermined outer surface portion of each chip, and then baked.

As for the cementing material for bonding the electrodes 4 of the wound chip coil onto the soldering lands 6a, the same material as the aforementioned electrode material is coated on the soldering lands 6a in the same manner as employed in the reflow soldering, and then, the wound chip coil 1 is mounted on the soldering lands 6a, which is followed by the step of heat curing.

As for the caulking material for the external wall of building, the aforementioned magnetic material composition can be employed. Namely, this magnetic material composition is used to fill the joint portions by making use of a filling machine, and then cured at the normal temperature. By the way, the curing involves crosslinking.

The examples of the polymer component consisting of polysulfide-based polymer or of polysulfide-based polymer and epoxy resin, which may or many not accompany powdery electronic material or other various kinds of additive are shown below.

(a) Where a mixture comprising of polysulfide-based polymer and epoxy resin is employed:

| | |
|---|---|
| Bisphenol A epoxy resin | 100 parts by weight |
| Polysulfide resin | 10–240 parts by weight |
| Curing agent | 2–50 parts by weight |
| Functional filler | 0–2300 parts by weight |
| Silica (filler) | 0–130 parts by weight |
| Silane coupling agent | 0–120 parts by weight |
| Solvent | 0–540 parts by weight |

(b) Where a mixture comprising of polysulfide-modified epoxy resin and polysulfide resin is employed:

| | |
|---|---|
| Polysulfide-modified epoxy resin | 100 parts by weight |
| Polysulfide resin | 0–200 parts by weight |
| Curing agent | 2–50 parts by weight |
| Functional filler | 0–2300 parts by weight |
| Silica (filler) | 0–130 parts by weight |
| Silane coupling agent | 0–120 parts by weight |
| Solvent | 0–540 parts by weight |

(c) Where a mixture comprising of epoxy resin (rubber filler dispersion type resin) and polysulfide resin is employed:

| | |
|---|---|
| epoxy resin (rubber filler dispersion type resin) | 100 parts by weight |
| Polysulfide resin | 10–200 parts by weight |
| Curing agent | 2–50 parts by weight |
| Functional filler | 0–2300 parts by weight |
| Silica (filler) | 0–130 parts by weight |

| Silane coupling agent | 0–120 parts by weight |
|---|---|
| Solvent | 0–540 parts by weight |

The aforementioned bisphenol A epoxy resin (weight average molecular weight=380; and epoxy equivalent=190) is available from Dainippon Ink Chemical Industries Co., Ltd.; the polysulfide resin is available from Tohre Co., Ltd. under the tradename of Thiocol LP3 (a polymer represented by the aforementioned general formula (1) and having a weight average molecular weight of 1000); the polysulfide-modified epoxy resin is available from Tohre Co., Ltd. under the tradename of Thiocol FLEP 60 (a reaction product between an epoxy resin having a weight average molecular weight of 560 and an epoxy equivalent of 280 and a polymer represented by the aforementioned general formula (1) and having a weight average molecular weight of 1000); the epoxy resin is a bisphenol F epoxy resin (weight average molecular weight=420; and epoxy equivalent=210) which is available from Nippon Shokubai Chemical Industries Co., Ltd. under the tradename of Eposet(BPF 307); the rubber filler is a crosslinked NBR elastomer which is avail-able from Nippon Synthetic Rubber Co., Ltd.; the curing agent is available from Ajinomoto Co., Ltd. under the tradename of PN-H; the functional filler is ferrite powder (Ni—Zn ferrite) which is available from Taiyo Yuden Co., Ltd. or a metallic powder such as silver powder; the silica is available from Nippon Silica Co., Ltd. under the tradename of SS50; the silane coupling agent is gamma-aluminopropylethoxy silane which is available from Nihon Yunika Co., Ltd.; non-limitative example of the solvent is 2-ethoxy ethyl acetate. The aforementioned resin component may be kneaded together with a functional filler and then, mixed with a curing agent (a latent curing agent) to form a high reliability one-pack type heat-curable resin composition.

An electronic material composition comprising a polymer component consisting of polysulfide-based polymer or of polysulfide-based polymer and epoxy resin exhibits, as it is cured, the aforementioned physical features (a) and (b), or (a) to (c), so that the cured product to be obtained therefrom is low in elastic modulus and excellent in flexibility. As a result, a covering body such as a packaging body, an electrode and a cementing body, which are obtained by making use of such an electronic material composition, are featured in that they can be hardly peeled off even if they are exposed to a stress of heat load, that they can be hardly cracked, and that they are excellent in reflow solderability as well as in stress relaxation.

An electronic material composition comprising a polymer component consisting of polysulfide-based polymer or of polysulfide-based polymer and epoxy resin, and a powdery electronic material exhibits, as it is cured, the aforementioned physical features (d) and (e), or (d) to (f), so that a molded body, a covering body, a cementing body and a filled body, which are obtained by making use of such an electronic material composition, are featured in that they can be hardly peeled off even if they are exposed to a stress of heat load, that they can be hardly cracked, and that they are excellent in reflow solderability as well as in stress relaxation.

This invention will be further explained with reference to the following examples.

EXAMPLE 1
(The Molding of the Core of Wound Chip Coil)

A magnetic material composition was prepared by mixing the following composition by means of a roll mill or a stirrer.

(Composition)

Chief ingredient A: Cresol novolac polyglycidyl ether
Chief ingredient B: Polysulfide polymer
Curing agent: Phenol novolac
Catalyst: 2-ethyl-4-methyl imidazole
Filler: Ni—Zn type ferrite powder (powdery magnetic material)
Releasing agent: Carnauba wax.

By the way, as for the polysulfide polymer, Thiocol LP-3 or FLEP 50 (Tohre Co., Ltd.) may be employed (the same hereinafter).

Based on 100 parts by weight of the filler, 8–10 parts by weight of the chief ingredient A, 10–15 parts by weight of the chief ingredient B, and 0.008–0.5 part by weight of each of other components were mixed together.

The magnetic material composition (45% by volume of powdery magnetic material) thus obtained was injection-molded and then cured in air atmosphere, at a temperature of 150° C. for 30 minutes to thereby obtain a core as shown in FIG. 2.

The physical properties (d) to (f) of the core thus obtained were then measured. Specifically, with respect to the features (d) and (e), they were determined by measuring the dispersibility of stiffness modulus relative to temperature according to dynamic viscoelasticity method, the results being shown in FIG. 9. With respect to the feature (f), when it was determined by measuring the dispersibility of stiffness modulus relative to time according to dynamic viscoelasticity method, non-linearity indicating a fracture could not be recognized as shown in FIG. 10. In FIG. 10, G' (Δ) [Pa] denotes dynamic storage elastic modulus, G" (□) [Pa] denotes dynamic loss modulus, tan δ (○) (wherein δ is a phase angle (phase shift between the stress and the strain vector)) denotes a mechanical loss (loss tangent), Temp (°C.) is temperature (°C.), and time (s) is based on seconds (the same hereinafter). The specific procedures for the measurements were performed based on "ARES Machine Manipulation Guide" (Leometric Scientific Epy Co., Ltd.) (the same hereinafter).

Figure 9:
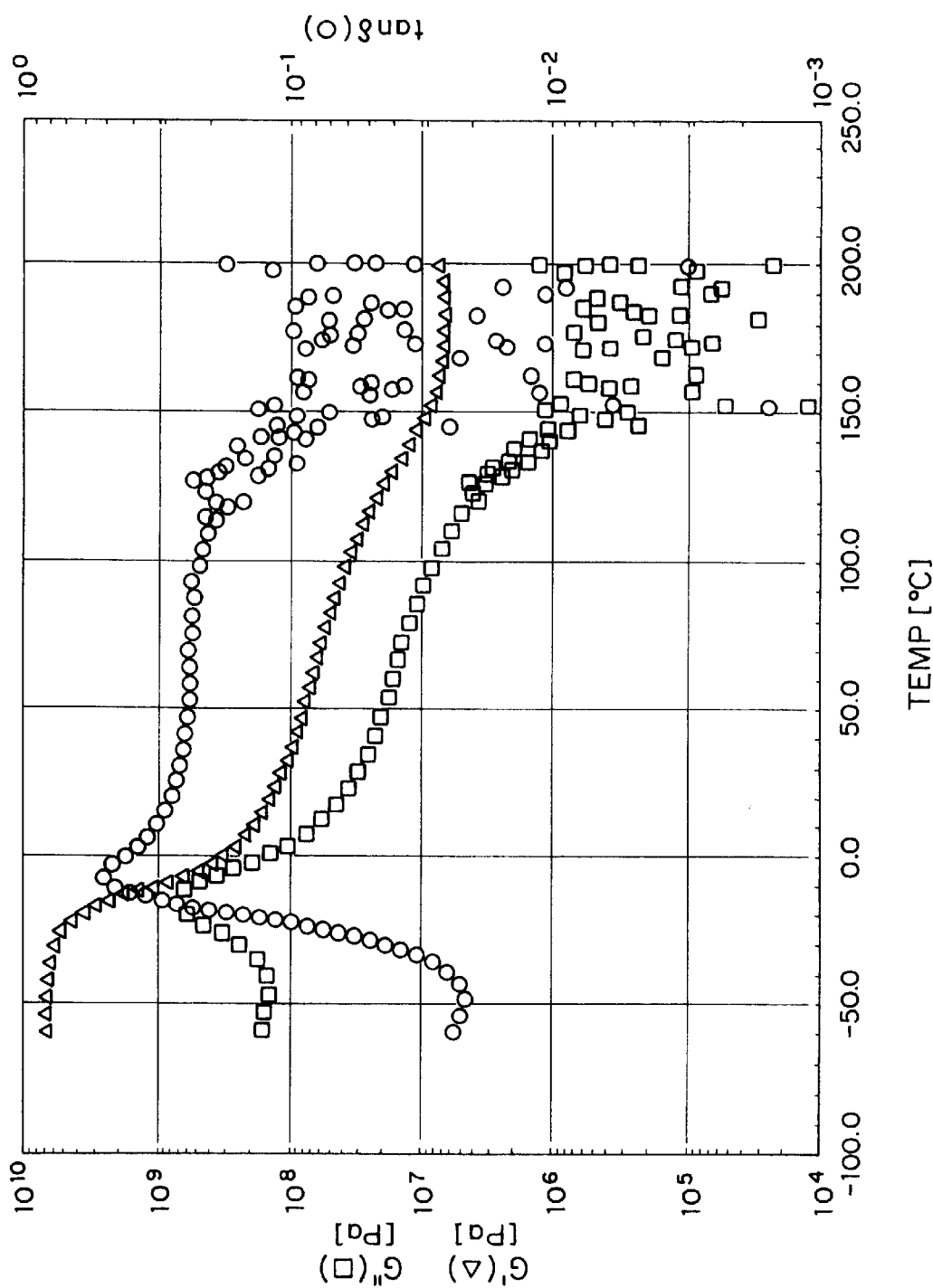
FIG. 9 is a graph illustrating a relationship between the physical property of electronic material composition according to one example of this invention and changes in temperature.
Figure 10:
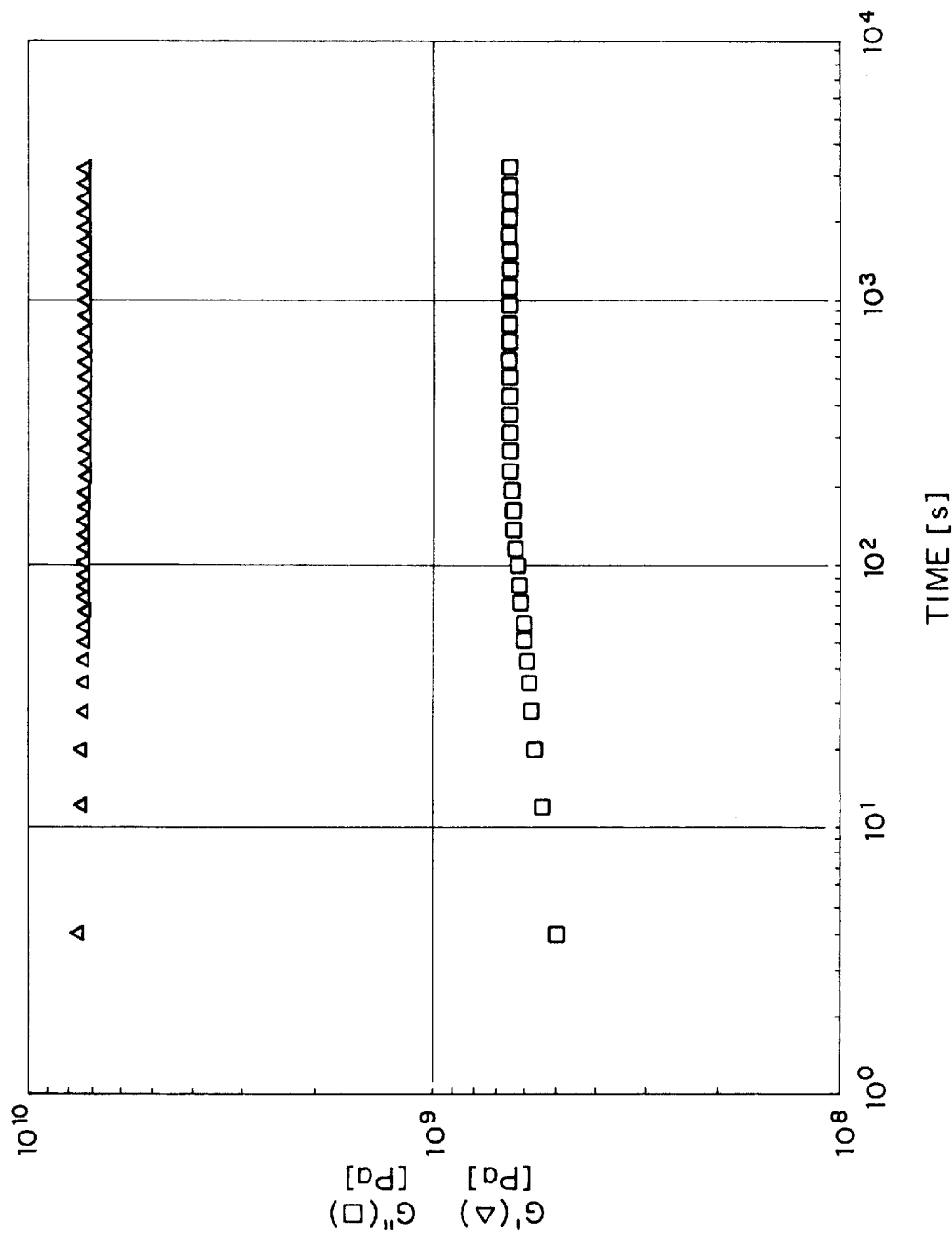
FIG. 10 is a graph illustrating a relationship between the physical property of electronic material composition according to one example of this invention and changes in time.

It will be found from FIG. 9 that the glass transition temperature based on G" and tan δ is −20° C. to −10° C., and that the dynamic storage elastic modulus (stiffness modulus) of the rubber state is 7×10⁶ Pa.

Further, when 100 pieces of wound chip coil where a winding was applied to the core as shown in FIG. 2 were subjected to 500 cycles, each cycle consisting of heating it up to 250 C. which is close to the maximum temperature electronic parts would have been heated during the step of reflow soldering and then cooling it down to the normal temperature, in a heat cycle test to investigate the generation of cracks or fracture, neither the crack nor the fracture were recognized at all.

EXAMPLE 2
(The Molding of the Core of Wound Chip Coil)

A magnetic material composition was prepared by mixing the following composition by means of a roll mill or a stirrer.

(Composition)

| | |
|---|---|
| Epoxy resin (ortho-cresol novolac epoxy resin) | 100 parts by weight |
| Polysulfide resin (Thiocol LP3) | 210 parts by weight |
| Curing agent (MY-H) | 20 parts by weight |
| Filler (Ni-Zn type ferrite) | 2000 parts by weight |

-continued (Composition)

| | |
|---|---|
| Silica (SS-50) | 23 parts by weight |
| Coupling agent (γ-aminopropylethoxy silane) | 20 parts by weight |
| Releasing agent (Carnauba wax) | 10 parts by weight |

The magnetic material composition (55% by volume of powdery magnetic material) thus obtained was injection-molded and then cured in air atmosphere, at a temperature of 150° C. for 30 minutes to thereby obtain a core as shown in FIG. 2.

The physical properties (d) to (f) of the core thus obtained were then measured in the same manner as in Example 1. Specifically, with respect to the features (d) and (e), they were determined on the basis of graph (temperature (C) dependency of G' and G") which was obtained by measuring the dispersibility of stiffness modulus relative to temperature according to dynamic viscoelasticity method. With respect to the feature (f), when it was determined by measuring the dispersibility of stiffness modulus relative to time according to dynamic viscoelasticity method, non-linearity indicating a fracture could not be recognized in the graph (time (sec.) dependency of G' and G").

It was found from these results that the glass transition temperature based on G" and tan δ is −20° C. to −10° C., and that the dynamic storage elastic modulus (stiffness modulus) of the rubber state is $5 \times 10^7$ Pa.

Further, when 100 pieces of wound chip coil where a winding was applied to the core as shown in FIG. 2 were subjected to 500 cycles, each cycle consisting of heating it up to 250° C. which is close to the maximum temperature electronic parts would have been heated during the step of reflow soldering and then cooling it down to the normal temperature, in a heat cycle test to investigate the generation of cracks or fracture, neither the crack nor the fracture were recognized at all.

The same experiment as that of Example 2 was performed except that the following composition was employed in place of the composition shown in Example 2, thus obtaining the almost the same results as those of Example 2.

(Composition)

| | |
|---|---|
| Polysulfide-modified epoxy resin (FREP 60) | 100 parts by weight |
| Polysulfide resin (Thiocol LP3) | 149 parts by weight |
| Curing agent (PN-H) | 10 parts by weight |
| Filler (Ni-Zn type ferrite) | 1245 parts by weight |
| Silica (SS-50) | 7 parts by weight |
| Coupling agent (γ-aminopropylethoxy silane) | 12 parts by weight |
| Solvent (2-ethoxyethyl acetate) | 194 parts by weight |

EXAMPLE 3
(The Packaging of the Core of Wound Chip Coil)

A magnetic material composition having a viscosity of 2 to 6 Pa·s (a value when the rotational speed was set to 50 rpm using No. 4 rotor in Brookfield B viscometer, the same hereinafter) was prepared by mixing the following composition by means of a ball mill, a roll mill or a stirrer.

(Composition)

Chief ingredient A: Bisphenol A diglycidyl ether
Chief ingredient B: Polysulfide polymer
Curing agent: Dicyandiamide
Catalyst: 2-ethyl-4-methyl imidazole
Filler A: Ni—Zn type ferrite powder (powdery magnetic material)
Filler B: Silica powder (filler)
Filler C: Carbon black (filler)
Solvent: Xylene Based on 100 parts by weight of the filler A, 8–10 parts by weight of the chief ingredient A, 10–15 parts by weight of the chief ingredient B, 0.008–0.5 part by weight of each of other components, and 10–20 parts by weight of the solvent were mixed together.

The magnetic material composition thus obtained was poured over the winding 3 shown in FIG. 2 by making use of a nozzle and, after being dried, cured in air atmosphere, at a temperature of 150° C. for 20 minutes to thereby obtain a packaged body.

Figure 11:
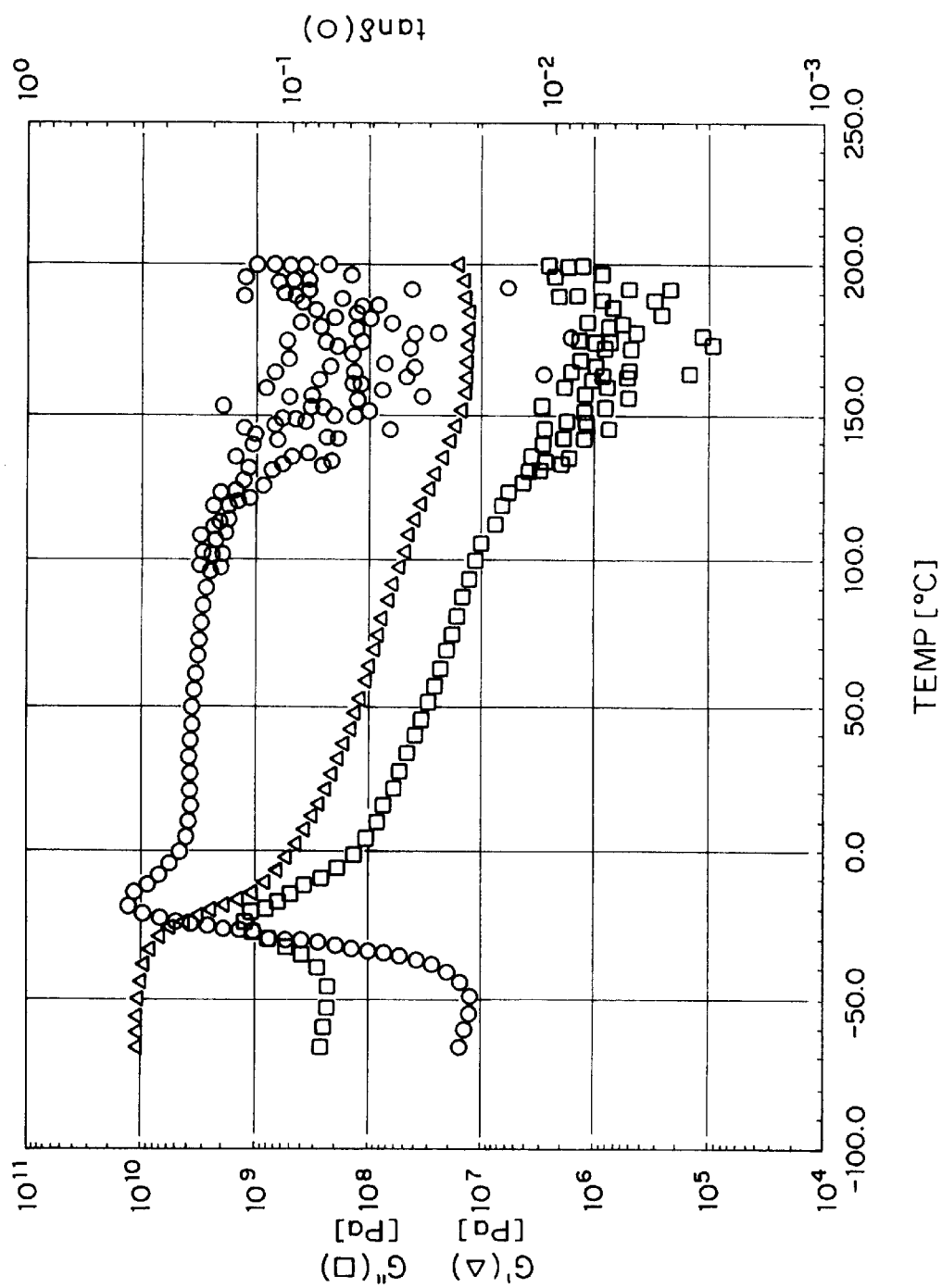
FIG. 11 is a graph illustrating a relationship between the physical property of electronic material composition according to another example of this invention and changes in temperature.

The physical properties (d) and (e) of the packaged body (the total of filler: 45 vol.%) thus cured were then measured in the same manner as described in Example 1 to obtain the results shown in FIG. 11. Further, when a test on the feature (f) was performed, the packaged body was found to meet this feature (f).

It will be found from FIG. 11 that the glass transition temperature based on G" and tan δ is −30° C. to −15° C. and that the dynamic storage elastic modulus (stiffness modulus) of the rubber state is $1.5 \times 10^7$ Pa.

By the way, although Ni—Zn type ferrite powder was employed as a powdery magnetic material in this example, the same kind of electronic material composition as described above except that this ferrite powder is not included may be employed for the covering or packaging, or the same kind of resinous material composition as described above except that these fillers are not included therein may be employed for the covering or packaging. When the packaged bodies thus cured in these cases were measured with respect to the aforementioned features (a) and (b) in the same manner as in the measurements of the aforementioned features (d) and (e), the results shown in FIG. 12 were obtained. Further, when a test on the feature (c) was performed in the same manner as in the measurement of the aforementioned feature (f), the packaged body was found to meet this feature (c).

Figure 12:
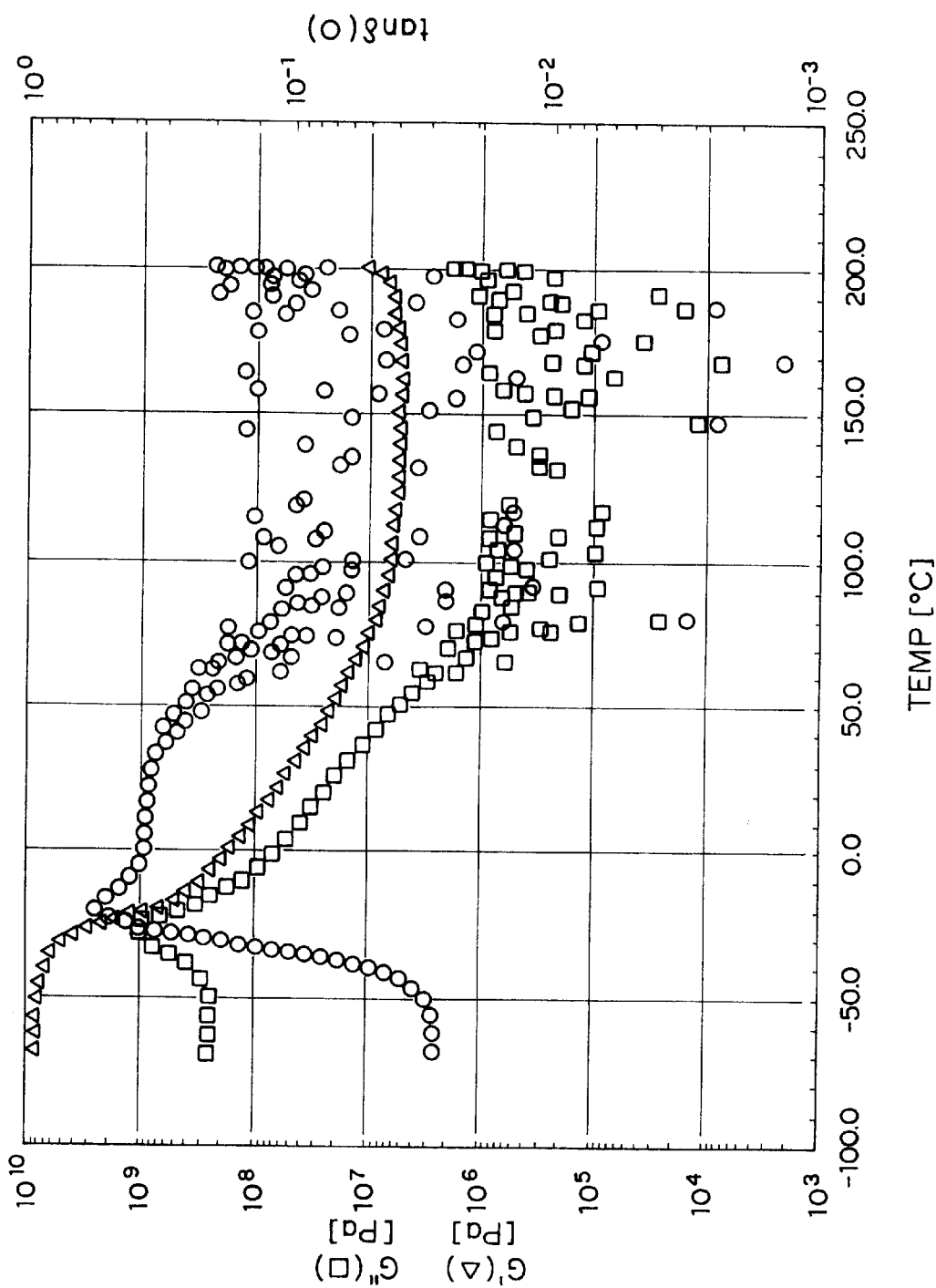
FIG. 12 is a graph illustrating a relationship between the physical property of electronic material composition according to a further example of this invention and changes in temperature.

It will be found from FIG. 12 that the glass transition temperature based on G" and tan δ is −35° C. to −20° C., and that the dynamic storage elastic modulus (stiffness modulus) of the rubber state is $6 \times 10^6$ Pa.

Further, when 10000 pieces of wound chip coil were subjected to a test wherein these wound chip coils were adsorbed through the packaged body of winding by making use of the absorption nozzle of mounter and mounted on predetermined positions of a printed wiring board, not a single mis-mount was recognized.

By the way, the wound chip coil may be entirely covered by the aforementioned magnetic material composition or resinous material composition, and then cured in the same manner as described above, thereby forming the packaging body of the wound chip coil.

EXAMPLE 4
(The Packaging of the Core of Wound Chip Coil).

A magnetic material composition having a viscosity of 2 to 6 Pa·s (a value when the rotational speed was set to 50 rpm using No. 4 rotor in Brookfield B viscometer, the same hereinafter) was prepared by mixing the following composition by means of a ball mill, a roll mill or a stirrer.

(Composition)

| | |
|---|---|
| Acryl rubber-containing bisphenol F epoxy resin (Eposet BPF307) | 100 parts by weight |
| Polysulfide resin (Thiocol LP3) | 200 parts by weight |
| Curing agent (PN-H) | 10 parts by weight |
| Filler (Ni-Zn type ferrite) | 1500 parts by weight |
| Silica (SS-50) | 18 parts by weight |
| Coupling agent (γ-aminopropylethoxy silane) | 20 parts by weight |
| Solvent (2-ethoxyethyl acetate) | 180 parts by weight |

The magnetic material composition thus obtained was poured over the winding 3 shown in FIG. 2 by making use of a nozzle and, after being dried, cured in air atmosphere, at a temperature of 150° C. for 20 minutes to thereby obtain a packaged body.

The physical properties (d) and (e) of the packaged body (the total of filler: 50 vol.%) thus cured were then measured in the same manner as described in Example 1 to obtain a graph. Further, when a test on the feature (f) was performed, the packaged body was found to meet this feature (f).

It will be found from the graph that the glass transition temperature based on G" and tan δ is −20° C. to 20° C., and that the dynamic storage elastic modulus (stiffness modulus) of the rubber state is about 8×10 Pa.

Further, when 100 pieces of wound chip coil were subjected to 500 cycles, each cycle consisting of heating it up to 250° C. which is close to the maximum temperature electronic parts would have been heated during the step of reflow soldering and then cooling it down to the normal temperature, in a heat cycle test to investigate the generation of cracks or fracture, neither the crack nor the fracture were recognized at all in the packaged body.

By the way, although Ni—Zn type ferrite powder was employed as a powdery magnetic material in this example, the same kind of electronic material composition as described above except that this ferrite powder is not included may be employed for the covering or packaging, or the same kind of resinous material composition as described above except that these fillers are not included therein may be employed for the covering or packaging. When the packaged bodies thus cured in these cases were measured with respect to the aforementioned features (a) and (b) in the same manner as in the measurements of the aforementioned features (d) and (e), a graph showing the results was obtained. Further, when a test on the feature (c) was performed in the same manner as in the measurement of the aforementioned feature (f), the packaged body was found to meet this feature (c).

It was found from the graph that the glass transition temperature based on G" and tan δ is −30° C. to −10° C., and that the dynamic storage elastic modulus (stiffness modulus) of the rubber state is 5×10$^6$ Pa.

Further, when 10000 pieces of wound chip coil were subjected to a test wherein these wound chip coils were adsorbed through the packaged body of winding by making use of the absorption nozzle of mounter and mounted on predetermined positions of a printed wiring board, not a single mis-mount was recognized.

By the way, the wound chip coil may be entirely covered by the aforementioned magnetic material composition or resinous material composition, and then cured in the same manner as described above, thereby forming the packaging body of the wound chip coil.

EXAMPLE 5

(The Formation of the Electromagnetic Shielding Layer of Casing)

The magnetic material composition obtained in Example 3 was heated in air atmosphere, at a temperature of 150° C. for 10 minutes, thereby turning the resin component into a semi-cured state or gel-like state. The resultant putty composition was then coated on the external wall of the casing of the display 11 and main body 12 by means of a hot melt coating method, which was followed by press-molding. The coated layer was then dried and heat-cured at a temperature of 150° C. for 60 minutes to form an electromagnetic shielding layer 13.

The physical properties of this electromagnetic shielding layer were found to have almost the same physical properties as those of the cured product of the aforementioned magnetic material composition.

The electromagnetic shielding layer 13 was found closely contacted with the corner portion of the step portion 12, and even if the electromagnetic shielding layer 13 was repeatedly subjected to a cold temperature of −50° C. and then to a hot temperature of +80° C. for 500 times in a repeated heat cycle test, the damage of the electromagnetic shielding layer 13 or the peeling of the electromagnetic shielding layer 13 away from the casing was not recognized.

By the way, the above magnetic material composition may be employed in the same manner as mentioned above as an outer sheath 22 or as a covering member for covering an electric wire 21 as shown in FIG. 5. The cable formed in this manner is not only capable of withstanding a complicated bending but also capable of withstanding the aforementioned heat cycle test.

EXAMPLE 6

(The Formation of the Electromagnetic Shielding Layer of Casing)

The magnetic material composition obtained in Example 4 was heated in air atmosphere, at a temperature of 150° C. for 10 minutes, thereby turning the resin component into a semi-cured state or gel-like state. The resultant putty composition was then coated on the external wall of the casing of the display 11 and main body 12 by means of a hot melt coating method, which was followed by press-molding. The coated layer was then dried and heat-cured at a temperature of 150° C. for 60 minutes to form an electromagnetic shielding layer 13.

The physical properties of this electromagnetic shielding layer were found to have almost the same physical properties as those of the cured product of the aforementioned magnetic material composition.

The electromagnetic shielding layer 13 was found closely contacted with the corner portion of the step portion 12, and even if the electromagnetic shielding layer 13 was repeatedly subjected to a cold temperature of −50° C. and then to a hot temperature of +80° C. for 500 times in a repeated heat cycle test, the damage of the electromagnetic shielding layer 13 or the peeling of the electromagnetic shielding layer 13 away from the casing was not recognized.

By the way, the above magnetic material composition may be employed in the same manner as mentioned above as an outer sheath 22 or as a covering member for covering an electric wire 21 as shown in FIG. 5. The cable formed in this manner is not only capable of withstanding a complicated bending but also capable of withstanding the aforementioned heat cycle test.

EXAMPLE 7
(The Formation of Electrodes)

A conductive material composition having a viscosity of 2 to 6 Pa·s was prepared by mixing the following composition by means of a ball mill, a roll mill or a stirrer.

(Composition)
- Chief ingredient A: Bisphenol A diglycidyl ether
- Chief ingredient B: Polysulfide polymer
- Curing agent: Dicyandiamide
- Catalyst: 2-ethyl-4-methyl imidazole
- Filler A: Ag powder
- Filler B: Carbon black (filler)
- Solvent: 2-ethoxyethyl acetate Based on 100 parts by weight of the filler A, 3–5 parts by weight of the filler B, 6–8 parts by weight of the chief ingredient A, 10–14 parts by weight of the chief ingredient B, 0.007–0.4 part by weight of each of other components, and 10–15 parts by weight of the solvent were mixed together.

The conductive material composition thus obtained was applied, by way of dipping, to the opposite ends of the wound chip coil shown in FIG. 2 and cured at a temperature of 150° C. for 60 minutes to thereby obtain a pair of external electrodes 4 as shown in FIG. 2. The thickness of the cured film (50 volume % in total of filler) was 50 μm.

Figure 8:
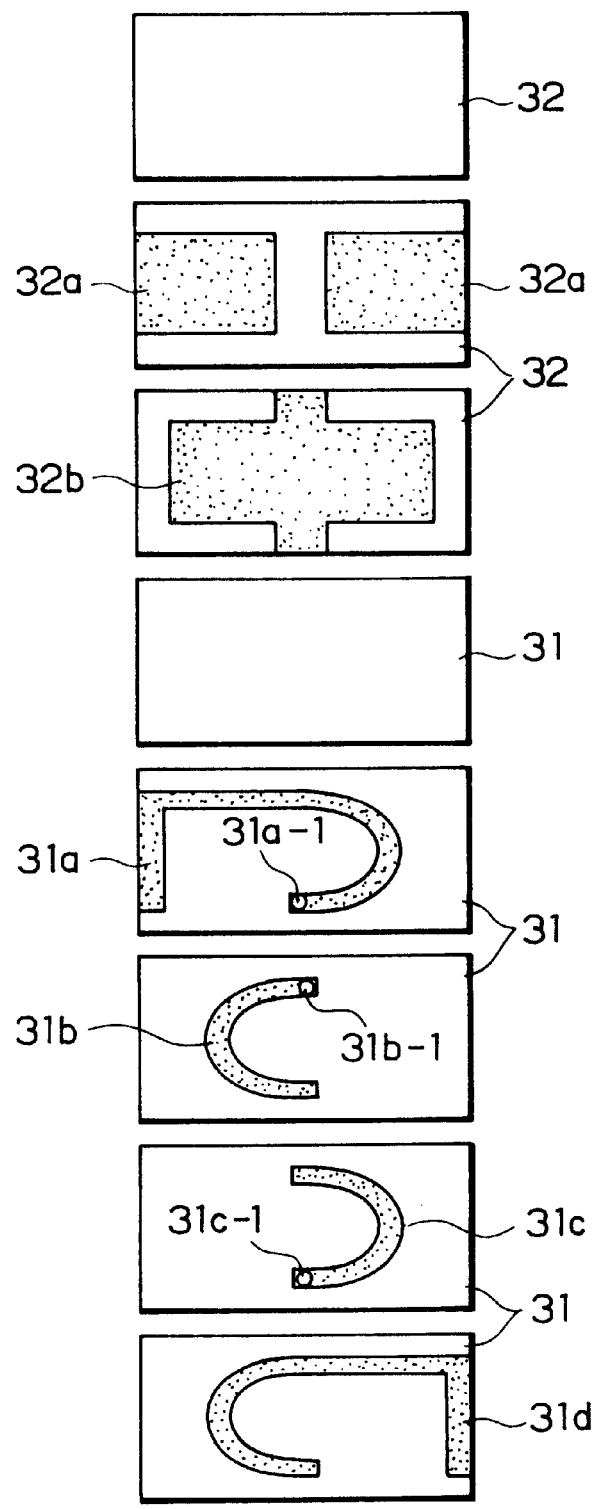
FIG. 8 is a schematic plan view illustrating a portion of an LC laminate composite electronic part.

For the purpose of investigating the physical properties of the external electrode thus obtained, a test piece was prepared in the same manner as described above except that the electrode was formed to a thickness of 0.2 mm on a releasable film by means of screen printing. Then, the physical properties (d) to (f) of the test piece were measured in the same manner as described for the core in Example 1. As a result, almost the same results as shown in FIG. 8 were obtained with respect to the features (d) and (e), while as for the feature (f), the test piece was found to meet this feature (f).

When 100 test pieces were subjected to a heat cycle test in the same manner as in Example 1, damage was not recognized in any of the test pieces.

By the way, it was also possible to form the external terminal electrodes 18 and 19 of the LC laminate composite electronic part as shown in FIG. 4 in the same manner as described above.

EXAMPLE 8
(The Formation of Electrodes)

A conductive material composition having a viscosity of 2 to 6 Pa·s was prepared by mixing the following composition by means of a ball mill, a roll mill or a stirrer.

| (Composition) | |
|---|---|
| Acryl rubber-containing bisphenol F epoxy resin (Eposet BPF307) | 100 parts by weight |
| Polysulfide resin (Thiocol LP3) | 188 parts by weight |
| Curing agent (PN-H) | 10 parts by weight |
| Filler (Ag powder) | 2600 parts by weight |
| Solvent (2-ethoxyethyl acetate) | 280 parts by weight |

The conductive material composition thus obtained was applied to both ends of the wound chip coil shown in FIG. 2 by means of dipping method and then, cured at a temperature of 150° C. for 60 minutes to thereby form the external electrodes 4. The thickness of the cured film (filler: 55% by volume in total) was 50 μm.

For the purpose of investigating the physical properties of the external electrode thus obtained, a test piece was prepared in the same manner as described above except that the electrode was formed to a thickness of 0.2 mm on a releasable film by means of screen printing. Then, the physical properties (d) to (f) of the test piece were measured in the same manner as described for the core in Example 1. As a result, almost the same results as shown in FIG. 8 were obtained with respect to the features (d) and (e), while as for the feature (f), the test piece was found to meet this feature (f).

When 100 test pieces were subjected to a heat cycle test in the same manner as in Example 1, damage was not recognized in any of the test pieces.

By the way, it was also possible to form the external terminal electrodes 18 and 19 of the LC laminate composite electronic part as shown in FIG. 4 in the same manner as described above.

EXAMPLE 9
(The Bonding Between the Electrode of a Chip Component and the Soldering Land of a Printed Wiring Board)

The conductive material composition employed in Example 7 was coated by means of screen printing method on the soldering lands 6a of the printed wiring board 6 shown in FIG. 2. Then, the electrodes 4 (the electrodes of Example 4) of the wound chip coil 1 was mounted on the uncured coated film. Then, the coated film was cured at a temperature of 150° C. for 60 minutes to thereby form the cemented bodies 7. The cemented bodies were found to have almost the same features as those of the test piece of Example 7.

EXAMPLE 10
(The Bonding Between the Electrode of a Chip Component and the Soldering Land of a Printed Wiring Board)

The conductive material composition employed in Example 8 was coated by means of screen printing method on the soldering lands 6a of the printed wiring board 6 shown in FIG. 2. Then, the electrodes 4 (the electrodes of Example 4) of the wound chip coil 1 was mounted on the uncured coated film. Then, the coated film was cured at a temperature of 150° C. for 60 minutes to thereby form the cemented bodies 7. The cemented bodies were found to have almost the same features as those of the test piece of Example 4.

EXAMPLE 11
(The Bonding of Green Sheet Laminates on the Occasion of Manufacturing an LC Laminate Composite Electronic Part)

Figure 7:
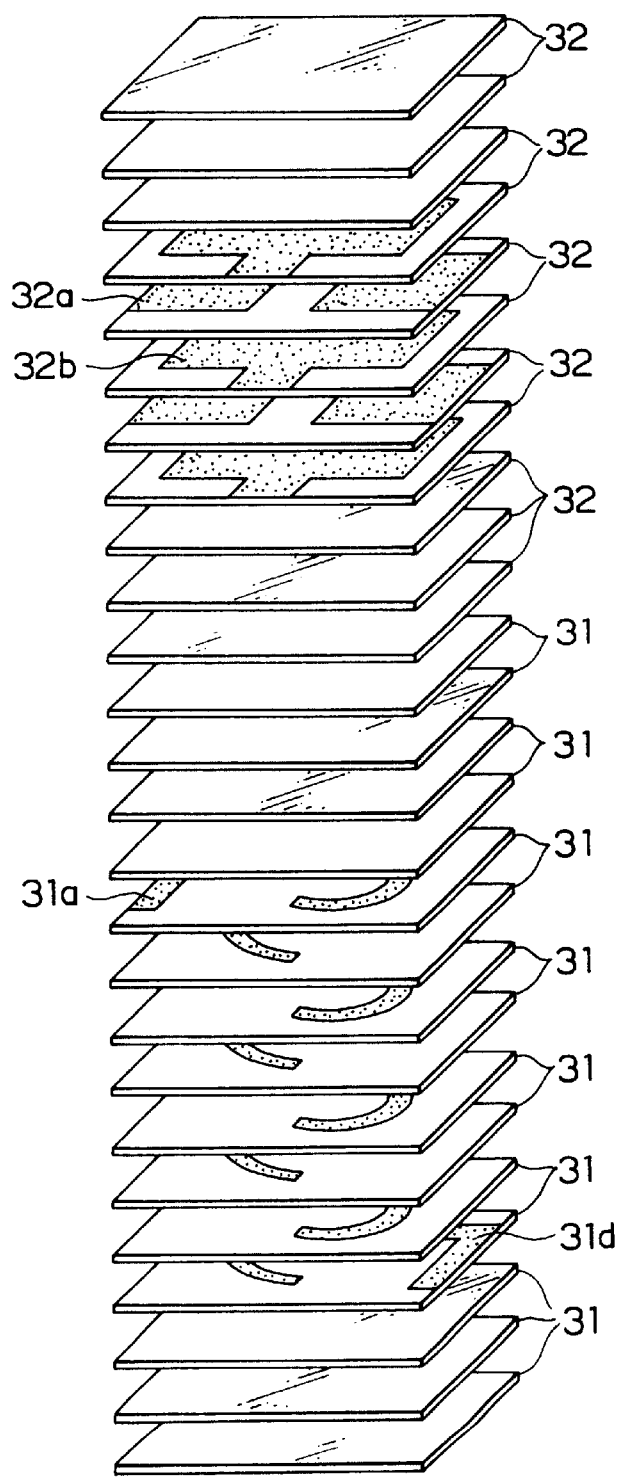
FIG. 7 is a perspective view illustrating one manufacturing step of an LC laminate composite electronic part according to a sixth example representing one of electronic products of this invention.

As shown in FIG. 7, coil patterns 31a, 31b, 31c and 31d shown in FIG. 8 were formed on each of ferrite green sheet 31, and then, three inductor ferrite green sheets provided separately with these coil patterns 31a, 31b and 31d were successively superimposed one upon another. Then, a couple of inductor ferrite green sheets provided separately with these coil patterns 31b and 31c were placed below the aforementioned laminate body. Furthermore, a inductor ferrite green sheet provided with the coil pattern 31d was placed below the laminate body obtained above, thereby forming an inductor ferrite green sheet laminate body. In this case, as shown in FIG. 8, each of these coil patterns are connected with each other via a conductive paste that had been filled in via-holes 31a-1, 31b-1 and 31c-1 that had been formed in advance in each of the patterns. Thereafter, three ferrite green sheets are superimposed on the top as well as on the bottom of aforementioned inductor ferrite green sheet laminate body.

Further, as shown in FIG. 8, inner electrode patterns 32a and 32b were respectively formed on each of the dielectric ceramic green sheets 32. Then, as shown in FIG. 7, a couple of condenser ceramic green sheets provided respectively with the inner electrode patterns 32a and 32b were successively superimposed one upon another. Thereafter, a laminate body that had been prepared in the same manner as described above was superimposed below the former laminate body, thereby forming a condenser ceramic green sheet laminate body. Thereafter, three dielectric ceramic green sheets 32 were superimposed on the top of the condenser ceramic green sheet laminate body, and a couple of dielectric ceramic green sheets 32 were superimposed on the bottom of the condenser ceramic green sheet laminate body.

As shown in FIG. 7, these green sheet laminate bodies were laminated one upon another with bonding green sheets 33 being interposed therebetween to obtain an LC green sheet laminate body. By the way, the bonding green sheet 33 was prepared in the same manner as the first mentioned green sheet except that the same kind of resinous material composition as employed in Example 3 was employed except that the Ni—Zn-based ferrite powder was removed from the magnetic material composition.

The LC green sheet laminate body was then pressed contacted with each other to form an unbaked component, and a plurality of which were then arranged inside a furnace to heat them at a temperature of 200° C. for one hour.

As a result, an LC element 14 comprising, as shown in FIG. 4, the condenser portion 15, the inductor portion 16 and a cementing body 17 interposed therebetween was obtained. Thereafter, a conductive paste comprising a metallic material consisting mainly of Ag and a resin component was coated on both ends of the LC element 14, thereby forming a conductive film connected with a lead-out portion of the coil and another conductive film connected with a lead-out portion of the condenser. These conductive films thus coated were then baked at a temperature of 150° C. for 30 minutes. The resultant conductive films were then subjected to a Ni plating and then to solder plating, thereby forming the external terminal electrodes 18 on both ends, and an earth side external terminal electrode 19 at an intermediate portion of the LC element 14.

By the way, the cementing body 17 is capable of relaxing a shrinkage stress that may be generated in the thermal hysteresis of the ferrite green sheet and the dielectric ceramic green sheet.

By the way, the condenser portion 15 and the inductor portion 16 may be separately formed, and then, they may be bonded to each other by making use of the aforementioned resinous material composition or an electronic material composition containing a filler, which is followed by the curing of these compositions.

If the aforementioned resinous material composition is to be employed as a bonding or cementing material, since the resin is low in elastic modulus and flexible irrespective of whether or not a filler is included therein, it is possible to relax a stress to be generated due to a difference in shrinkage percentage of each of the green sheet laminates during the baking, thereby making it possible to prevent cracks from generating in the baked product.

After the condenser portion 15 and the inductor portion 16 were separately formed, they were bonded to each other by making use of the aforementioned electronic material composition containing no powdery electronic material and cured. Then, 100 pieces of the cured LC laminate composite electronic parts were subjected to the same heat cycle test as in Example 1, finding that any of these electronic parts were free from damage.

EXAMPLE 12

(The Bonding of Green Sheet Laminates on the Occasion of Manufacturing an LC Laminate Composite Electronic Part)

As shown in FIG. 7, the green sheet laminate bodies obtained in the same manner as in Example 11 were laminated one upon another with bonding green sheets being interposed therebetween to obtain an LC green sheet laminate body. In this case, the bonding green sheet was prepared in the same manner as the first mentioned green sheet except that the same kind of resinous material composition as employed in Example 4 was employed except that the Ni—Zn-based ferrite powder was removed from the magnetic material composition.

The LC green sheet laminate body was then pressed contacted with each other to form an unbaked component, and a plurality of which were then arranged inside a furnace to heat them at a temperature of 200° C. for one hour.

As a result, an LC element 14 comprising, as shown in FIG. 4, the condenser portion 15, the inductor portion 16 and a cementing body 17 interposed therebetween was obtained. Thereafter, a conductive paste comprising a metallic material consisting mainly of Ag and a resin component was coated on both ends of the LC element 14, thereby forming a conductive film connected with a lead-out portion of the coil and another conductive film connected with a lead-out portion of the condenser. These conductive films thus coated were then baked at a temperature of 150° C. for 30 minutes. The resultant conductive films were then subjected to a Ni plating and then to solder plating, thereby forming the external terminal electrodes 18 on both ends, and an earth side external terminal electrode 19 at an intermediate portion of the LC element 14.

By the way, the cementing body 17 is capable of relaxing a shrinkage stress that maybe generated in the thermal hysteresis of the ferrite green sheet and the dielectric ceramic green sheet.

By the way, the condenser portion 15 and the inductor portion 16 may be separately formed, and then, they may be bonded to each other by making use of the aforementioned resinous material composition or an electronic material composition containing a filler, which is followed by the curing of these compositions.

If the aforementioned resinous material composition is to be employed as a bonding or cementing material, since the resin is low in elastic modulus and flexible irrespective of whether or not a filler is included therein, it is possible to relax a stress to be generated due to a difference in shrinkage percentage of each of the green sheet laminates during the baking, thereby making it possible to prevent cracks from generating in the baked product.

After the condenser portion 15 and the inductor portion 16 were separately formed, they were bonded to each other by making use of the aforementioned electronic material composition containing no powdery electronic material and cured. Then, 100 pieces of the cured LC laminate composite electronic parts were subjected to the same heat cycle test as in Example 1, finding that any of these electronic parts were free from damage.

EXAMPLE 13

(The Filling of Caulking Material for the External Wall of Building)

The magnetic material composition employed in Example 1 was filled in the joint portions of the electromagnetic shielding boards or tiles shown in FIG. 6, and then, allowed to air dry.

As a result, the filled body thus formed exhibited almost the same performance as that of the core of Example 1.

EXAMPLE 14

(The Filling of Caulking Material for the External Wall of Building)

The magnetic material composition employed in Example 2 was filled in the joint portions of the electromagnetic shielding boards or tiles shown in FIG. 6, and then, allowed to air dry.

As a result, the filled body thus formed exhibited almost the same performance as that of the core of Example 2.

COMPARATIVE EXAMPLE 1

Figure 13:
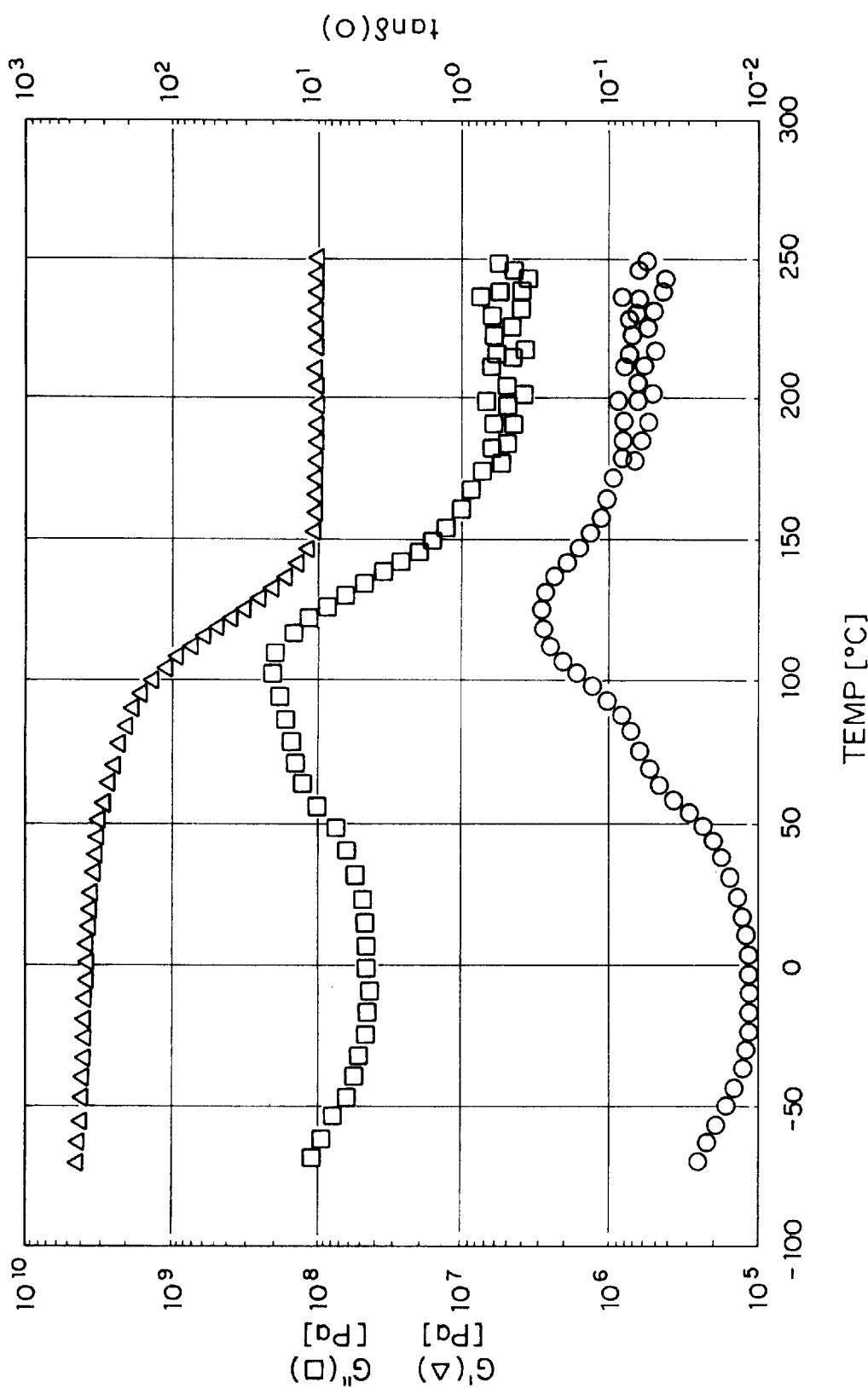
FIG. 13 is a graph illustrating a relationship between the physical property of electronic material composition according to a comparative example and changes in temperature, which corresponds to FIG. 9.

A core was prepared in the same manner as in Example 1 by making use of a magnetic material composition except that the chief ingredient B: polysulfide polymer was not included therein and the content of the chief ingredient A: cresol novolac polyglycidyl ether was increased proportionally. Then, the physical properties (d) and (e) of the core thus obtained were measured finding the results as shown in FIG. 13, and the core was also incapable of meeting the feature of (f). It will be found from FIG. 13 that the glass transition temperature based on G" and tan δ is 100° C. to 130° C., and that the dynamic storage elastic modulus (stiffness modulus) of the rubber state is $10^8$ Pa.

Further, when 100 pieces of wound chip coil where a winding was applied to the core as shown in FIG. 2 were subjected to the same heat cycle test as in Example 1, finding the generation of cracks in 20 pieces of the sample.

COMPARATIVE EXAMPLE 2

A core was prepared in the same manner as in Example 2 by making use of a magnetic material composition except that the polysulfide polymer was not included therein and the content of the epoxy resin was substituted therefor. Then, the physical properties (d) and (e) of the core thus obtained were measured from the graph. The core was incapable of meeting the feature of (f). It was found from graph that the glass transition temperature based on G" and tan δ was 80° C. to 120° C., and that the dynamic storage elastic modulus (stiffness modulus) of the rubber state was $6 \times 10^8$ Pa.

Further, when 100 pieces of wound chip coil where a winding was applied to the core as shown in FIG. 2 were subjected to the same heat cycle test as in Example 1, finding the generation of cracks in 20 pieces of the sample.

COMPARATIVE EXAMPLE 3

Figure 14:
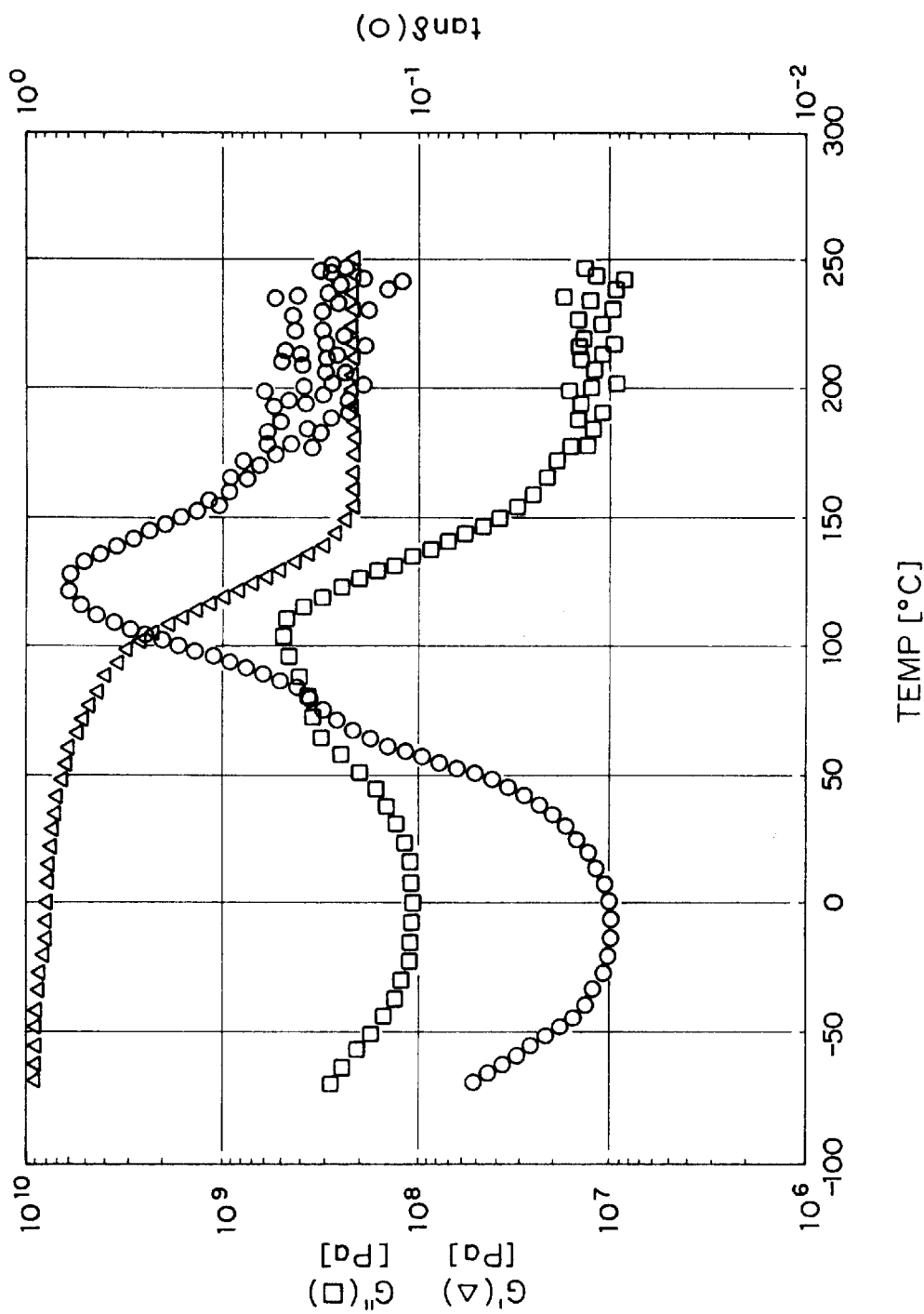
FIG. 14 is a graph illustrating a relationship between the physical property of electronic material composition according to a comparative example and changes in temperature, which corresponds to FIG. 11.

A packaged body was prepared in the same manner as in Example 3 by making use of a magnetic material composition except that the chief ingredient B: polysulfide polymer was not included therein and the content of the chief ingredient A: bisphenol A diglycidyl ether was increased proportionally. Then, the physical properties (d) and (e) of the packaged body thus cured were measured in the same manner as in Example 2, finding the results as shown in FIG. 14 and the core was also incapable of meeting the feature of (f). It will be found from FIG. 14 that the glass transition temperature based on G" and tan δ is 100° C. to 130° C., and that the dynamic storage elastic modulus (stiffness modulus) of the rubber state is $2 \times 10^8$ Pa.

When 10000 pieces of wound chip coil were subjected to a test wherein these wound chip coils were adsorbed through the packaged body of winding by making use of the absorption nozzle of mounter and mounted on predetermined positions of a printed wiring board, mis-mount was recognized in five samples.

COMPARATIVE EXAMPLE 4

A packaged body was prepared in the same manner as in Example 4by making use of a magnetic material composition except that the polysulfide polymer was not included therein and the content of the epoxy resin was substituted therefor. Then, the physical properties (d) and (e) of the packaged body thus obtained were measured to obtain a graph. When a test on the feature (f) was performed, it was found that the packaged body was incapable of meeting the feature of (f). It was found from graph that the glass transition temperature based on G" and tan δ was 100° C. to 120° C., and that the dynamic storage elastic modulus (stiffness modulus) of the rubber state was $8 \times 10^8$ Pa.

Further, when 100 pieces of wound chip coil were subjected to 500cycles, each cycle consisting of heating it up to 250° C. which is close to the maximum temperature electronic parts would have been heated during the step of reflow soldering and then cooling it down to the normal temperature, in a heat cycle test to investigate the generation of cracks or fracture, the cracks and the fracture were recognized in 65 samples of the packaged body.

When 10000 pieces of wound chip coil were subjected to a test wherein these wound chip coils were adsorbed through the packaged body of winding by making use of the absorption nozzle of mounter and mounted on predetermined positions of a printed wiring board, mis-mount was recognized in seven samples.

COMPARATIVE EXAMPLE 5

An electromagnetic shielding layer was formed in the same manner as in Example 5 except that the magnetic material composition was replaced by the magnetic material composition which was employed in Comparative Example 3, finding that the electromagnetic shielding layer was not closely adhered to the corner portion of the step portion 12 shown in FIG. 2. Further, when a heat cycle test was performed in the same manner as in Example 5, cracks were recognized in the electromagnetic shielding layer.

COMPARATIVE EXAMPLE 6

An electromagnetic shielding layer was formed in the same manner as in Example 6 except that the magnetic material composition was replaced by the magnetic material composition which was employed in Comparative Example 4, finding that the electromagnetic shielding layer was not closely adhered to the corner portion of the step portion 12 shown in FIG. 2. Further, when a heat cycle test was performed in the same manner as in Example 3, cracks were recognized in the electromagnetic shielding layer.

COMPARATIVE EXAMPLE 7

An electrode and test piece were prepared in the same manner as in Example 7 by making use of a conductive material composition except that the chief ingredient B: polysulfide polymer was not included therein and the content of the chief ingredient A: bisphenol A diglycidyl ether was increased proportionally.

When 100 pieces of the test piece were subjected to a heat cycle test in the same manner as in Example 4, cracks were recognized in 6 samples.

As for the features of (d) and (e), the results were the same as in Comparative Example 2, and also these samples were failed to meet the feature (f).

COMPARATIVE EXAMPLE 8

An electrode and test piece were prepared in the same manner as in Example 8 by making use of a conductive material composition except that the polysulfide-polymer was not included therein and the content of the epoxy resin was substituted therefor.

When 100 pieces of the test piece were subjected to a heat cycle test in the same manner as in Example 4, cracks were recognized in 15 samples. As for the features of (d) and (e), the results were the same as in Comparative Example 2, and also these samples were failed to meet the feature (f).

COMPARATIVE EXAMPLE 9

A joint body was formed in the same manner as in Example 9 except that the conductive material composition was replaced by the conductive material composition which was employed in Comparative Example 7.

As a result, the same results as obtained in Comparative Example 7 were obtained in this joint body.

COMPARATIVE EXAMPLE 10

A joint body was formed in the same manner as in Example 10 except that the conductive material composition was replaced by the conductive material composition which was employed in Comparative Example 8.

As a result, the-same results as obtained in Comparative Example 8 were obtained in this joint body.

COMPARATIVE EXAMPLE 11

The condenser portion 15 and the inductor portion 16 were separately formed, and then, they were bonded to each other by making use of an electronic material composition to manufacture an LC laminate composite electric part, wherein the electronic material composition employed in Comparative Example 2 was substituted for the electronic material composition containing no electronic material powder employed in Example 11.

When 100 pieces of the LC laminate composite electric part were subjected to a test in the same manner as in Example 6, the separation of the joint portion was recognized in two samples.

COMPARATIVE EXAMPLE 12

The condenser portion 15 and the inductor portion 16 were separately formed, and then, they were bonded to each other by making use of an electronic material composition to manufacture an LC laminate composite electric part, wherein the electronic material composition employed in Comparative Example 2 was substituted for the electronic material composition containing no electronic material powder employed in Example 12.

When 100 pieces of the LC laminate composite electric part were subjected to a test in the same manner as in Example 6, the separation of the joint portion was recognized in ten samples.

It will be seen from these results, the glass transition temperature of a cured product of the electronic material composition containing electric material powder should preferably be in the range of $-50°$ C. to $0°$ C., more preferably in the range of $-35°$ C. to $-5°$ C., and the stiffness modulus (G') of the rubber state should preferably be in the range of $5\times10^6$ Pa to $8\times10^7$ Pa. On the other hand, the glass transition temperature of a cured product of the electronic material composition containing no electric material powder should preferably be in the range of $-500°$ C. to $0°$ C., more preferably in the range of $-40°$ C. to $-25°$ C., and the dynamic storage elastic modulus (stiffness modulus) (G') of the rubber state should preferably be in the range of $4\times10^6$ Pa to $8\times10^6$ Pa.

According to this invention, it is possible to provide an electronic material composition comprising a resin having the aforementioned physical features (a) to (c) and also to provide an electronic material composition further comprising an electronic material powder and having the aforementioned physical features (d) to (f), so that even if the a molded body such as the core of wound chip coil for instance is miniaturized, the mechanical strength thereof can be enhanced and hence the yield thereof can be improved. Furthermore, the electronic material composition of this invention can be used for manufacturing various kinds of electronic parts having an excellent performance, e.g. for manufacturing a bulky packaged body which is excellent in resistance to a stress to be generated on the occasion of heat loading such as reflow soldering or heat cycle test, or which can be easily adsorbed by the adsorption nozzle of mounter, for manufacturing an electromagnetic shield which is sufficiently effective to a casing having an odd-shaped surface, or for manufacturing the skin component of cable which is capable of preventing radiation noises. Furthermore, according to the electronic material composition of this invention, it is also possible to obtain an outer electrode for electronic parts which is capable of relaxing a stress that might be generated due to changes in temperature of electronic parts mounted on a printed wiring board, to obtain a cementing material for bonding an outer electrode onto the printed wiring board, the cementing material being capable of relaxing a stress to be imposed thereon and also capable of absorbing a difference in irreversible expansion coefficient or shrinkage factor among the bonded members on the occasion of heat treatment, thereby making it possible to prevent the cementing material from being cracked.

Additionally, it is also possible according to this invention to provide a filling component which is capable of preventing electromagnetic wave from leaking through joint portions of electromagnetic shielding boards or tiles of building, thereby making it possible to improve the electromagnetic shielding effect of electromagnetic shielding wall.

It is also possible to reduce the quantity of curing of a resin after the application thereof, thereby preventing the generation of damages of the relevant objects due to the heating for the curing thereof. Therefore, it is possible according to this invention to provide a using method of an electromagnetic composition, which is capable of improving the workability, and to provide an electronic product to be obtained therefrom.

What is claimed is:

1. A composition comprising at least a curable polysulfide-based polymer and a powdery electronic material, and exhibiting the following physical properties (a) and (b) after being cured to form a cured body;
   (a) temperature characteristic in relative to stiffness modulus, which is featured in that a glass transition temperature in a process of shifting the cured body from a glassy state to a rubbery state due to the change of stiffness modulus in relative to temperature is in the range of $-50$ to $50°$ C.; and
   (b) stiffness modulus in said rubbery state which is in the range of $10^5$ Pa to $10^7$ Pa.

2. A composition comprising at least a curable polysulfide-based polymer and a powdery electronic material, and exhibiting the following physical properties (a), (b) and (c) after being cured to form a cured body;
- (a) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;
- (b) stiffness modulus in said rubbery state which is in the range of $10^5$ Pa to $10^7$ Pa; and
- (c) extensibility which cannot be destroyed even if said cured body is subjected to a shear deformation of 5% at a temperature of −50° C.

3. A composition comprising at least powdery electronic material and a curable polysulfide-based polymer, and exhibiting the following physical properties (d) and (e) after being cured to form a cured body;
- (d) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.; and
- (e) stiffness modulus in said rubbery state which is in the range of $10^6$ Pa to $10^8$ Pa.

4. A composition comprising at least powdery electronic material and a curable polysulfide-based polymer, and exhibiting the following physical properties (d), (e) and (f) after being cured to form a cured body;
- (d) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;
- (e) stiffness modulus in said rubbery state which is in the range of $10^6$ Pa to $10^8$ Pa; and
- (f) extensibility which cannot be destroyed even if said cured body is subjected to a shear deformation of 2% at a temperature of −50° C.

5. The composition according to any one of claims 1 to 4, wherein the polysulfide-based polymer contains a polysulfide rubber skeleton (—S—S—).

6. The composition according to claim 5, wherein the polysulfide-based polymer is polysulfide.

7. The composition according to claim 6, wherein the composition is adapted for use for forming an electronic component and formulated into a raw material for forming a body selected from the group consisting of a molded body, a packed body, a covering body, an electrode and a joining body.

8. The composition according to claim 5, wherein the polysulfide-based polymer is polysulfide-modified epoxy polymer which is a reaction product between polysulfide and an epoxy compound.

9. The composition according to claim 8, wherein the composition is adapted for use for forming an electronic component and formulated into a raw material for forming a body selected from the group consisting of a molded body, a packed body, a covering body, an electrode and a joining body.

10. The composition according to claim 5, wherein the composition is adapted for use for forming an electronic component and formulated into a raw material for forming a body selected from the group consisting of a molded body, a packed body, a covering body, an electrode and a joining body.

11. The composition according to any one of claims 1 to 4, wherein said powdery electronic material is at least one selected from the group consisting of a magnetic material and conductive material.

12. The composition according to claim 11, wherein said magnetic material is powdery ferrite.

13. The composition according to claim 11, wherein said conductive material is a metallic powder.

14. The composition according to claim 13, wherein said metallic powder is selected from the group consisting of silver powder and copper powder.

15. The composition according to any one of claims 1 to 4, wherein the composition is adapted for use for forming an electronic component and formulated into a raw material for forming a body selected from the group consisting of a molded body, a packed body, a covering body, an electrode and a joining body.

16. An electronic component comprising
a body selected from the group consisting of a molded body, a packed body, a covering body, an electrode and a joining body, said body comprising a composition comprising at least a curable polysulfide-based polymer and a powdery electronic material, and exhibiting the following physical properties: (1)(a) and (b); or (2)(a), (b) and (c); or (3)(d) and (e); or (4)(d), (e) and (f) after being cured to form a cured body;
- (a) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;
- (b) stiffness modulus in said rubbery state which is in the range of $10^5$ Pa to $10^7$ Pa;
- (c) extensibility which cannot be destroyed even if said cured body is subjected to a shear deformation of 5% at a temperature of −50° C.;
- (d) temperature characteristic in relative to stiffness modulus, which is featured in that a glass transition temperature in a process of shifting the cured body from a glassy state to a rubbery state due to the change of stiffness modulus in relative to temperature is in the range of −50 to 50° C.;
- (e) stiffness modulus in said rubbery state which is in the range of $10^6$ Pa to $10^8$ Pa; and
- (f) extensibility which cannot be destroyed even if said cured body is subjected to a shear deformation of 2% at a temperature of −50° C.

17. The electronic component according to claim 16, wherein the molded body is a core of wound chip coil which can be obtained by means of molding, and the electronic component is a wound chip coil having said core.

18. The electronic component according to claim 16, wherein the covering body is an external packaging covering the winding of wound chip coil, and the electronic component is a wound chip coil having said external packaging.

19. The electronic component according to claim 16, wherein the covering body is an electromagnetic shielding covering body for a casing, and the electronic component is a casing for an electromagnetic component having said electromagnetic shielding covering body.

20. The electronic component according to claim 16, wherein the covering body is a cable sheath for preventing radiant noise, and the electronic component is a radiant noise-free cable having said cable sheath for preventing radiant noise.

21. The electronic component according to claim 16, wherein the covering body is an external packaging body for packaging mounted components on a printed wiring board, and the electronic component is a printed wiring board having said external packaging.

22. The electronic component according to claim 16, wherein the packed body is obtained by making use of an electromagnetic shielding caulking material as a filler for filling a gap between the electromagnetic shielding boards, panels or tiles, which are designed to form an electromagnetic shielding wall, and the electronic component is an electromagnetic shielding wall having said packed body.

23. The electronic component according to claim 16, wherein the electrode is an external electrode of a chip type electronic component, and the electronic component is a chip type electronic component having said electrode.

24. The electronic component according to claim 16, wherein the joining body is a conductive connecting body for connecting an external electrode of chip component with a soldering land of a printed wiring board, and the electronic component is a printed wiring board having said conductive connecting body.

25. The electronic component according to claim 16, wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

26. The electronic component according to claim 16, wherein the joining body is designed to connect a plurality of members, each member exhibiting a different linear expansion coefficient from one another, and the electronic component is an electronic component having said plurality of members which are connected through said joining body.

27. The electronic component according to claim 16, wherein said polysulfide-based polymer is polysulfide.

28. The electronic component according to claim 27, wherein the molded body is a core of wound chip coil which can be obtained by means of molding, and the electronic component is a wound chip coil having said core.

29. The electronic component according to claim 27, wherein the covering body is an external packaging covering the winding of wound chip coil, and the electronic component is a wound chip coil having said external packaging.

30. The electronic component according to claim 27, wherein the covering body is an electromagnetic shielding covering body for a casing, and the electronic component is a casing for an electromagnetic component having said electromagnetic shielding covering body.

31. The electronic component according to claim 27, wherein the covering body is a cable sheath for preventing radiant noise, and the electronic component is a radiant noise-free cable having said cable sheath for preventing radiant noise.

32. The electronic component according to claim 27, wherein the covering body is an external packaging body for packaging mounted components on a printed wiring board, and the electronic component is a printed wiring board having said external packaging.

33. The electronic component according to claim 27, wherein the packed body is obtained by making use of an electromagnetic shielding caulking material as a filler for filling a gap between the electromagnetic shielding boards, panels or tiles which are designed to form an electromagnetic shielding wall, and the electronic component is an electromagnetic shielding wall having said packed body.

34. The electronic component according to claim 27, wherein the electrode is an external electrode of a chip type electronic component, and the electronic component is a chip type electronic component having said electrode.

35. The electronic component according to claim 27, wherein the joining body is a conductive connecting body for connecting an external electrode of chip component with a soldering land of a printed wiring board, and the electronic component is a printed wiring board having said conductive connecting body.

36. The electronic component according to claim 27, wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

37. The electronic component according to claim 27, wherein the joining body is designed to connect a plurality of members, each member exhibiting a different linear expansion coefficient from one another, and the electronic component is an electronic component having said plurality of members which are connected through said joining body.

38. The electronic component according to claim 16, wherein polysulfide-based polymer is polysulfide-modified epoxy polymer which is a reaction product between polysulfide and an epoxy compound.

39. The electronic component according to claim 38, wherein the molded body is a core of wound chip coil which can be obtained by means of molding, and the electronic component is a wound chip coil having said core.

40. The electronic component according to claim 38, wherein the covering body is an external packaging covering the winding of wound chip coil, and the electronic component is a wound chip coil having said external packaging.

41. The electronic component according to claim 38, wherein the covering body is an electromagnetic shielding covering body for a casing, and the electronic component is a casing for an electromagnetic component having said electromagnetic shielding covering body.

42. The electronic component according to claim 38, wherein the covering body is a cable sheath for preventing radiant noise, and the electronic component is a radiant noise-free cable having said cable sheath for preventing radiant noise.

43. The electronic component according to claim 38, wherein the covering body is an external packaging body for packaging mounted components on a printed wiring board, and the electronic component is a printed wiring board having said external packaging.

44. The electronic component according to claim 38, wherein the packed body is obtained by making use of an electromagnetic shielding caulking material as a filler for filling a gap between the electromagnetic shielding boards, panels or tiles, which are designed to form an electromagnetic shielding wall, and the electronic component is an electromagnetic shielding wall having said packed body.

45. The electronic component according to claim 38, wherein the electrode is an external electrode of a chip type electronic component, and the electronic component is a chip type electronic component having said electrode.

46. The electronic component according to claim 38, wherein the joining body is a conductive connecting body for connecting an external electrode of chip component with a soldering land of a printed wiring board, and the electronic component is a printed wiring board having said conductive connecting body.

47. The electronic component according to claim 38, wherein the joining body is an interface connecting body for connecting a pair of members with each other through the interface thereof, each member exhibiting a different irreversible expansion coefficient or shrinkage factor from the other as they are heat-treated, and the electronic component is a composite electronic component wherein said members are connected with each other via said interface connecting body and heat-treated.

48. The electronic component according to claim 38, wherein the joining body is designed to connect a plurality of members, each member exhibiting a different linear expansion coefficient from one another, and the electronic component is an electronic component having said plurality of members which are connected through said joining body.

49. An electronic component according to claim 16, wherein said composition exhibits physical properties (a) and (b).

50. An electronic component according to claim 16, wherein said composition exhibits physical properties (a), (b) and (c).

51. An electronic component according to claim 16, wherein said composition exhibits physical properties (d) and (e).

52. An electronic component according to claim 16, wherein said composition exhibits physical properties (d), (e) and (f).

53. A method of using an electronic material composition, which comprises the steps of;
- forming an electronic component having a semi-cured state of a molded body, a packed body, a covering body, an electrode or a joining body by making use of a composition comprising at least a curable polysulfide-based polymer and a powdery electronic material, and exhibiting the following physical properties: (1)(a) and (b); or (2)(a), (b) and (c); or (3)(d) and (e); or (4)(d), (e) and (f), after being cured to form a cured body;
  - (a) temperature characteristic in relative to stiffness modulus, which is featured in that a glass transition temperature in a process of shifting the cured body from a glassy state to a rubbery state due to the change of stiffness modulus in relative to temperature is in the range of $-50$ to $50°$ C.;
  - (b) stiffness modulus in said rubbery state which is in the range of $10^5$ Pa to $10^7$ Pa;
  - (c) extensibility which cannot be destroyed even if said cured body is subjected to a shear deformation of 5% at a temperature of $-50°$ C.;
  - (d) temperature characteristic in relative to stiffness modulus, which is featured in that a glass transition temperature in a process of shifting the cured body from a glassy state to a rubbery state due to the change of stiffness modulus in relative to temperature is in the range of $-50$ to $50°$ C.;
  - (e) stiffness modulus in said rubbery state which is in the range of $10^6$ Pa to $10^8$ Pa; and
  - (f) extensibility which cannot be destroyed even if said cured body is subjected to a shear deformation of 2% at a temperature of $-50°$ C.; and
- completely curing the molded body, the packed body, the covering body, the electrode or the joining body to obtain the electronic component having a cured state of the molded body, the packed body, the covering body, the electrode or the joining body.

54. The method of using an electronic material composition according to claim 53, wherein said polysulfide-based polymer is polysulfide.

55. The method of using an electronic material composition according to claim 53, wherein said polysulfide-based polymer is polysulfide-modified epoxy polymer which is a reaction product between polysulfide and an epoxy compound.

56. The method according to claim 53, wherein said composition exhibits physical properties (a) and (b).

57. The method according to claim 53, wherein said composition exhibits physical properties (a), (b) and (c).

58. The method according to claim 53, wherein said composition exhibits physical properties (d) and (e).

59. The method according to claim 53, wherein said composition exhibits physical properties (d), (e) and (f).

* * * * *